(12) United States Patent
Tanizawa

(10) Patent No.: US 7,639,169 B2
(45) Date of Patent: Dec. 29, 2009

(54) A/D CONVERTER CIRCUIT AND A/D CONVERSION METHOD

(75) Inventor: Yukihiko Tanizawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/153,219

(22) Filed: May 15, 2008

(65) Prior Publication Data
US 2008/0309542 A1    Dec. 18, 2008

(30) Foreign Application Priority Data

May 17, 2007  (JP)  ............................ 2007-131945
Oct. 9, 2007   (JP)  ............................ 2007-263297

(51) Int. Cl.
*H03M 1/12*   (2006.01)
(52) U.S. Cl. ...................... 341/155; 341/156
(58) Field of Classification Search ................ 341/155, 341/156, 157, 166, 118
See application file for complete search history.

(56) References Cited

U.S. PATENT DOCUMENTS

| | | | |
|---|---|---|---|
| 5,396,247 A | 3/1995 | Watanabe et al. | |
| 6,466,151 B2 | 10/2002 | Nishii et al. | |
| 6,771,202 B2 | 8/2004 | Watanabe et al. | |
| 6,850,178 B2 | 2/2005 | Watanabe | |
| 6,861,967 B2 | 3/2005 | Tanizawa | |
| 6,879,278 B2 | 4/2005 | Watanabe et al. | |
| 6,891,491 B2 | 5/2005 | Nakamura et al. | |
| 6,940,443 B2 | 9/2005 | Terazawa et al. | |
| 7,330,144 B2 | 2/2008 | Terazawa et al. | |
| 2004/0239546 A1* | 12/2004 | Watanabe et al. | ........... 341/157 |
| 2005/0062482 A1 | 3/2005 | Vincent et al. | |
| 2005/0285769 A1 | 12/2005 | Harada et al. | |

FOREIGN PATENT DOCUMENTS

| | | |
|---|---|---|
| JP | A-05-037378 | 2/1993 |
| JP | A-08-075876 | 3/1996 |

OTHER PUBLICATIONS

Office Action dated Jan. 19, 2009 in corresponding Japanese patent application No. 2007-263297 (and English translation).
U.S. Appl. No. 12/153,218, filed May 15, 2008, Tanizawa.
Extended European Search Report dated Sep. 2, 2008 in corresponding European patent application No. 08009032.7-2206.

* cited by examiner

*Primary Examiner*—Rexford N Barnie
*Assistant Examiner*—Joseph Lauture
(74) *Attorney, Agent, or Firm*—Posz Law Group, PLC

(57) ABSTRACT

An A/D converter circuit has a first ring delay line and a second ring delay line configured to vary respective characteristics in the same manner relative to a change in the ambient temperature. A reference voltage, which is free from a change in temperature, is fed as a power supply voltage to the second ring delay line. Digital data produced by the first ring delay line is temperature-compensated by digital data produced by the second ring delay line.

17 Claims, 24 Drawing Sheets

A/D CONVERTER CIRCUIT AND A/D CONVERSION METHOD

CROSS REFERENCE TO RELATED APPLICATION

This application is based on and incorporates herein by reference Japanese Patent Applications No. 2007-131945 filed on May 17, 2007 and No. 2007-263297 filed on Oct. 9, 2007.

FIELD OF THE INVENTION

This invention relates to an A/D converter circuit and an A/D conversion method for converting an analog voltage signal input to an input signal line into a binary digital data and outputting the same to an output data line.

BACKGROUND OF THE INVENTION

U.S. Pat. No. 5,396,247 (JP 3064644), for example, discloses an A/D converter circuit for converting an analog voltage signal input to an input signal line into a binary digital data and outputting it to an output data line. In this A/D converter circuit, a plurality of inverting circuits are connected in a ring form to form a pulse circulating circuit, and an input voltage which is an analog input is applied as a power supply voltage to each of the inverting circuits to convert the input voltage into a digital data by utilizing the fact that an inverting operation time of the inverting circuits varies depending upon the power supply voltage.

In the A/D converter circuit of this type, however, the inverting circuit of which the inverting operation time varies depending upon the power supply voltage is formed by semiconductors such as MOS transistors; i.e., the inverting operation time varies depending upon the temperature due to its characteristics. Therefore, a data value output being converted into a digital data based on an input voltage input as a power supply voltage to the inverting circuit is subject to vary depending also upon a change in the ambient temperature.

U.S. Pat. No. 6,891,491 (JP 2004-274157A) discloses a method of correcting non-linearity and an apparatus for correcting non-linearity of the A/D-converted output data. According to this correction method, an approximated straight line or curve is calculated or corrected relying upon a digital operation to suppress variation in the digital data caused by the ambient temperature.

According to this correction method, however, it is necessary to repeat a predetermined arithmetic operation for every A/D conversion to digitally operate the approximated straight line or curve. Therefore, even if a variation in the digital data caused by the ambient temperature can be suppressed, the scale of the arithmetic processing circuit increases and, besides, an extended period of time is required for the complicated operation that occurs repetitively. Thus, this technology is not suited for high-speed A/D conversion processing.

The above problem can be technically solved by utilizing a GaAs device capable of executing the arithmetic operation at high speeds for the arithmetic processing circuit. However, the cost of the GaAs device itself and the presence of the pulse circulating circuit that does not require high-speed processing necessitate a new step in the process for producing the semiconductors and increases costs of production.

SUMMARY OF THE INVENTION

It is therefore an object of the present invention to provide an A/D converter circuit and an A/D conversion method capable of suppressing variation in digital data caused by a change in ambient temperature without requiring complicated arithmetic processing.

According to the present invention, an analog voltage signal is input to an input signal line and converted into a binary digital data. Specifically, the analog voltage signal is supplied to a first pulse circulating circuit, in which a plurality of inverting circuits is coupled in a ring form, so that the plurality of inverting circuits operates with the analog voltage signal and circulates a pulse signal therein. The number of times of circulation of the pulse signal in the first pulse circulating circuit is counted by a first counter. An analog reference voltage signal is also supplied to a second pulse circulating circuit, in which a plurality of inverting circuits is coupled in a ring form in the same configuration as in the first pulse circulating circuit, so that the plurality of inverting circuits operates with the analog reference voltage signal and circulates the pulse signal therein in the same manner as in the first pulse circulating circuit. The number of times of circulation of the pulse signal in the second pulse circulating circuit is counted by a second counter. At the time point when a counted value of the second counter reaches a predetermined value, a counted value of the first counter is output. The two counted values of the two counters are subjected to subtraction to output a digital output corresponding to the analog voltage signal.

BRIEF DESCRIPTION OF THE DRAWINGS

The above and other objects, features and advantages of the present invention will become more apparent from the following detailed description made with reference to the accompanying drawings. In the drawings.

DESCRIPTION OF THE PREFERRED EMBODIMENTS

First Embodiment

Figure 1:
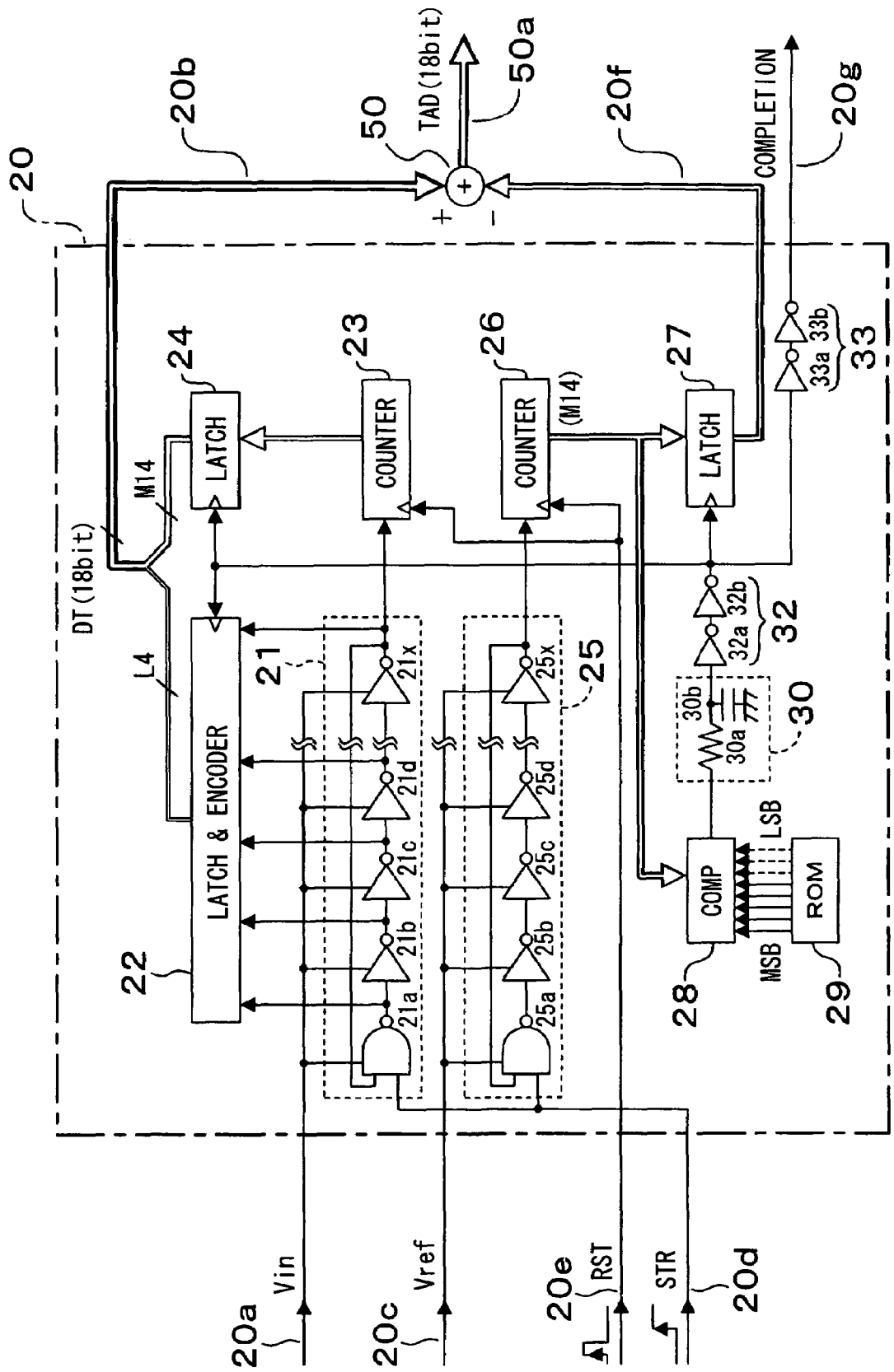
FIG. 1 is a circuit diagram showing an A/D converter circuit according to a first embodiment of the invention.

Referring to FIG. 1, an A/D converter circuit 20 is provided for converting an analog input voltage Vin input to an input line 20a into a binary digital data DT and for outputting it to an output line 20b, and is formed by a first ring delay line 21, a latch and encoder 22, a first counter 23, a first latch 24, a second ring delay line 25, a second counter 26, a second latch 27, a digital comparator 28, a ROM 29, a low-pass filter (LPF) 30, and output buffers 32 and 33 and the like. The A/D converter circuit 20, as will be described below, utilizes the fact that the inverting operation time of the inverting circuits in the first ring delay line 21 differs depending upon the input voltage Vin.

The first ring delay line 21 is formed by coupling a plurality of inverting circuits 21a, 21b, 21c, 21d to 21x in a ring form, the plurality of inverting circuits using the input voltage Vin input from the input line 20a as a power supply voltage and of which the inverting operation time for inverting and outputting the input signal varying depending upon the power supply voltage. Here, one of the plurality of inverting circuits, such as the inverting circuit 21a, is formed as a NAND circuit 21a of which the inverting operation can be controlled from the outer side by, for example, a start signal STR. The pulse signal circulates therein accompanying the start of operation of the NAND circuit 21a. The first ring delay line 21 operates as a first pulse circulating circuit.

Among the inverting circuits 21a, 21b, 21c, 21d to 21x, in order to distinguish the NAND circuit 21a over other inverting circuits 21b, 21c, 21d to 21x, the inverting circuits 21b, 21c, 21d to 21x will hereinafter be described as INV circuits 21b, 21c, 21d to 21x.

That is, the NAND circuit 21a and INV circuits 21b, 21c, 21d to 21x forming the first ring delay line 21 are connected in series in a ring form in order to convert the logical value of the input pulse signal (Hi→Lo, Lo→Hi) and to output the output signal to the next INV circuit, and are connected in parallel with the latch and encoder 22 so that the outputs of the NAND circuit 21a and of the INV circuits 21b, 21c, 21d to 21x can be input to the latch and encoder 22 in parallel.

The power supply voltage for driving the NAND circuit 21a and INV circuits 21b to 21x is not fed from a stable constant-voltage source, but is fed from the input line 20a. That is, the inverting circuits (NAND circuit 21a and INV circuits 21b, etc.) forming the first ring delay line 21 receive, as a power supply voltage, an analog input voltage Vin that is to be converted into a binary digital data DT, and its voltage level is subject to vary.

An output terminal of the last INV circuit 21x is connected to the one input terminal of the first NAND circuit 21a to cyclically input the signal thereto and is, further, connected to an input terminal of the first counter 23 so as to input the signal to the first counter 23, too. A start signal line 20d, on the other hand, is connected to the other input terminal of the NAND circuit 21a to which no signal is cyclically input. This enables the inverting operation of the NAND circuit 21a when the logic level of the start signal STR input from the start signal line 20d is in the Hi state and prohibits the inverting operation of the NAND circuit 21a when the logic level of the start signal STR is in the Lo state.

Based on the output signals output from the NAND circuit 21a and INV circuits 21b, 21c, 21d to 21x in the first ring delay line 21, the latch and encoder 22 detects a position where the pulse signal is circulating in the first ring delay line 21, and outputs the digital data corresponding to the circulating position, i.e., forms a least and less significant (subordinate) data contributing to enhancing the resolution.

That is, the output terminals of the NAND circuit 21a and of the INV circuits 21b, 21c, 21d to 21x are connected to the parallel input terminals of the latch and encoder 22, and the pulse signal circulating through the first ring delay line 21 is picked up by the logic level Hi or Lo input through these terminals to detect the position thereof (encoder function). Further, a digital comparator 28 and the like that will be described later are connected to the latch and encoder 22, so that a latch signal can be input thereto. Therefore, the data of the circulating position of the pulse signal (e.g., a 4-bit digital data in the first embodiment) that is detected is latched at a rising time point of the latch signal and is output to the output line 20b (latching function).

That is, the latch and encoder 22 has a function for outputting, to the output line 20b, the digital data output by the encoder function as the least significant 4 bits (L4) of the 18 bits which are part of the binary digital data DT at a time point (predetermined time point) of the rising edge (or falling edge) of the latch signal. In this respect, therefore, the latch and encoder 22 operates as converted data output control means.

The first counter 23 has a function for counting the number of times of circulation of the pulse signal circulating in the first ring delay line 21 and for outputting the counted value, and its input terminal is connected to the output terminal of the INV circuit 21x in the first ring delay line 21 and its output terminal is connected to the input terminal of the first latch 24. Further, a reset signal line 20e is connected to a reset terminal thereof since it is necessary to initialize the counted value by a reset signal RST input from an external unit.

Therefore, responsive to the rising edge (or falling edge) of the reset signal RST input from the reset signal line 20e, the counted value of the first counter 23 is reset and, therefore, the number of times of circulation of the pulse signal circulating in the first ring delay line 21 is counted responsive to the start signal STR, and the number of times of circulation counted from moment to moment is output as the counted value to the first latch 24.

The first latch 24 has a function for outputting the counted value from the first counter 23 as most significant (superior) 14-bit data M14 among the 18 bits which are the remainder of the binary digital data DT to the output line 20b at a time point (predetermined time point) of the rising edge (or falling edge) of the latch signal. Therefore, the first latch 24 operates as converted data output control means.

That is, the output terminal of the first counter 23 is connected to the input terminal of the first latch 24, and the digital comparator 28 and the like that will be described later are connected thereto so that a latch signal can be input thereto. Therefore, the data related to the counted value input from the first counter 23 is latched at the rising time point of the latch signal and is output to the output line 20b.

As described above, the most significant 14-bit data M14 of the binary digital data DT is output from the first latch 24 and the least significant 4-bit data L4 of the digital data DT is output from the latch and encoder 22 at the same time point to the output line 20b of the A/D converter circuit 20. Thus, it is made possible to convert the analog input voltage Vin input to the input line 20a into an 18-bit digital data DT.

That is, the inverting operation time by the NAND circuit 21a and INV circuits 21b, 21c, 21d to 21x forming the first ring delay line 21 varies depending upon the power supply voltage. Therefore, the digital data DT output from the output line 20b varies depending upon the voltage level of the analog input voltage Vin. The variation operates as the input voltage Vin if the time interval Ts is equally set from the rise (shift from Lo to Hi) of the start signal STR input from the start signal line 20d to the rising edge of the latch signal. Therefore, the digital data DT output from the output line 20b is the one produced by converting the analog input voltage Vin input to the input line 20a into the binary data.

As described above, the A/D converter circuit 20 has a function for converting the analog input voltage Vin input to the input line 20a into a binary digital data DT and outputting it to the output line 20b. However, the inverting operation time of the NAND circuit 21a and INV circuits 21b, 21c, 21d to 21x forming the first ring delay line 21 varies depending upon the temperature, and hence the data value fluctuates due to a change in the ambient temperature of the first ring delay line 21.

Figure 6A:
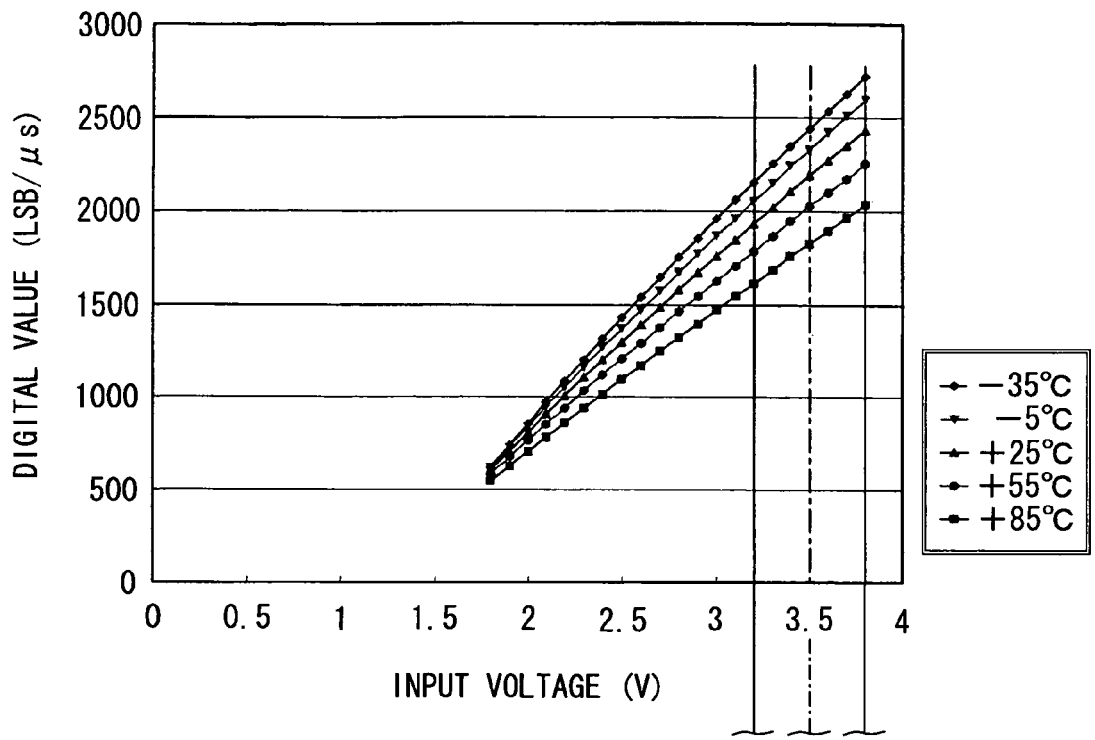
FIG. 6A is a graph showing changes in a TAD output value (converted value) relative to a voltage input to the A/D converter circuit depending upon the temperature according to the first embodiment.

FIG. 6A is a diagram of characteristics of a ring delay line fabricated by a semiconductor process. In this example where an input voltage Vin of 3.5 V is input (voltage on the abscissa in FIG. 6A), a value of digital data DT (digital value on the ordinate in FIG. 6A) output from the output line 20b varies over 1800 to 2450 (LSB/µs) depending upon the ambient temperature (+85° C. to −35° C.). Therefore, the first embodiment is provided with a second ring delay line 25, a second counter 26, a second latch 27, a digital comparator 28 and the like to suppress the variation in the digital data due to a change in the ambient temperature. Here, "LSB/µs" indicates a data value corresponding to a sampling period of 1 µs when the weight of the least significant bit of the digital data DT is set to $2^0$ (=1). Here, the sampling period is a time interval Ts from the rise of the start signal STR to the rising edge of the latch signal.

The second ring delay line 25 is formed by coupling inverting circuits 25a, 25b, 25c, 25d to 25x which use a reference voltage Vref (predetermined reference voltage) input from the reference voltage line 20c as a power supply voltage and of which the inverting operation time for inverting and outputting the input signal varying depending upon the power supply voltage in the same number and in the same connection as the inverting circuits 21a, 21b, 21c, 21d to 21x forming the first ring delay line 21, a NAND circuit 25a which is one of the plurality of inverting circuits 25a, etc. starting the operation simultaneously with the start of operation of the NAND circuit 21a in the first ring delay line 21. The second ring delay line 25 operates as a second pulse circulating circuit.

That is, the NAND circuit 25a and INV circuits 25b, 25c, 25d to 25x forming the second ring delay line 25 are connected in series in a ring form in order to convert the logical value of the input pulse signal (Hi→Lo, Lo→Hi) and to output the output signal to the next INV circuit. Further, the output terminal of the last INV circuit 25x is connected to the one input terminal of the first NAND circuit 25a to cyclically input the signal thereto and is, further, connected to an input terminal of the second counter 26. On the other hand, the start signal line 20d is connected to the other input terminal of the NAND circuit 25a which does not receive the cyclic input. This enables the inverting operation of the NAND circuit 25a when the logic level of the start signal STR input from the start signal line 20d is in the Hi state and prohibits the inverting operation of the NAND circuit 25a when the logic level of the start signal STR is in the Lo state.

Figure 2:
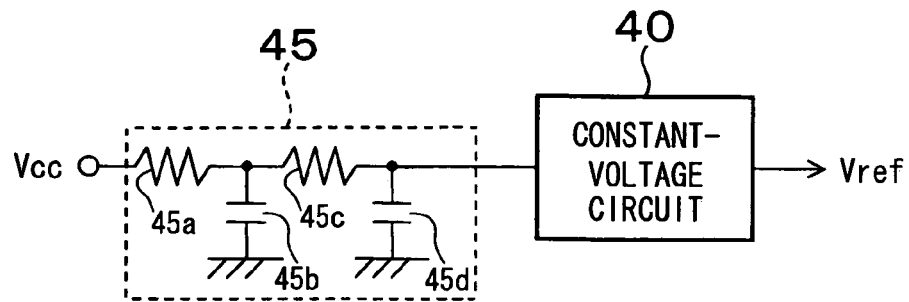
FIG. 2 is a diagram illustrating a power source for feeding a reference voltage shown in FIG. 1.

The power supply voltage fed for driving the NAND circuit 25a and INV circuits 25b, etc. is fed from the reference voltage line 20c connected to a stabilized constant-voltage source and is capable of producing a reference voltage Vref, unlike the first ring delay line 21. As shown in FIG. 2, for example, a constant-voltage circuit 40 (e.g., a band-gap type constant-voltage circuit which uses a band-gap voltage as the reference voltage) that drops a DC voltage Vcc of a nominal voltage of +5 V input from an external power source down to a stabilized or regulated reference voltage Vref (DC voltage) of +3.5 V, is connected to the reference voltage line 20c. Thus, the reference voltage Vref which does not almost vary depending upon the temperature is produced as an output voltage even if the ambient temperature of the A/D converter circuit 20 varies.

Figure 6B:
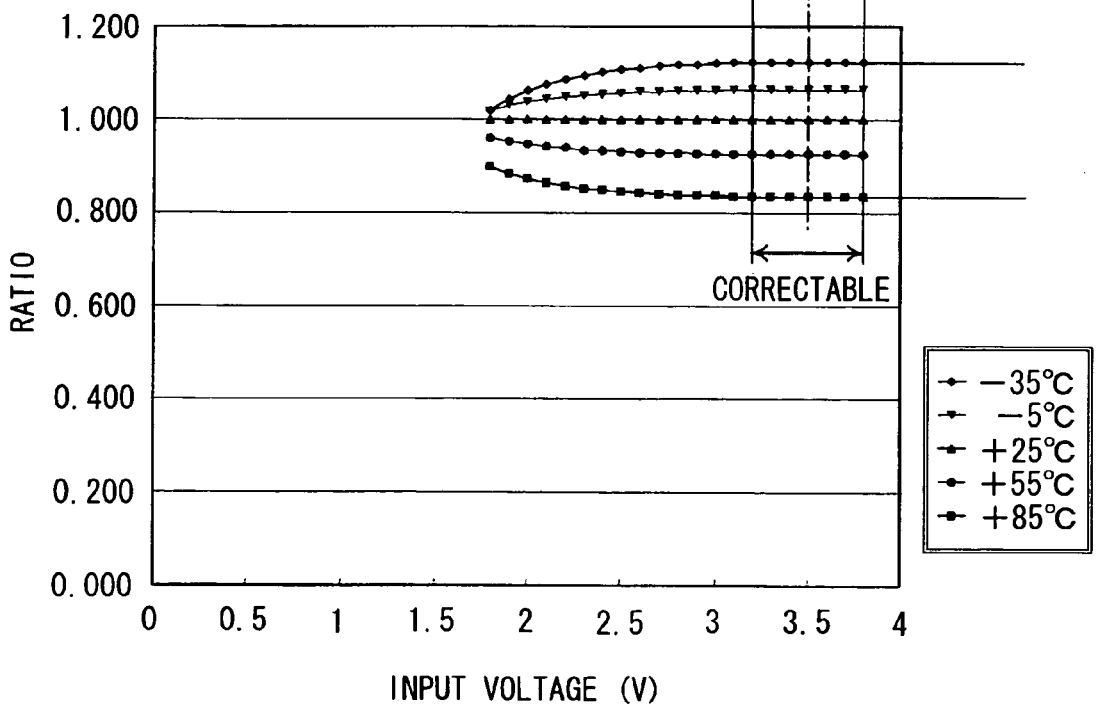
FIG. 6B is a graph showing variation ratios (converted value ratios) of temperature characteristics shown in FIG. 6A with +25° C. as a reference.

FIG. 6A is a diagram of temperature characteristics showing a relationship between the power supply voltage of the ring delay line and the digital data DT, and FIG. 6B is a diagram showing the relationship of FIG. 6A at ratios with +25° C. as a reference. The reference voltage Vref is set at 3.5 V on which the value of digital data DT varies at the same ratio in a range of 3.5±0.3 V of FIG. 6B even if the ambient temperature of the A/D converter circuit 20 varies over −35° C. to +85° C.

As shown in FIG. 2, further, between the external power source (DC voltage source) that outputs the DC voltage Vcc and the constant-voltage circuit 40, there is interposed a noise-removing filter 45 for suppressing variation in the DC voltage Vcc, i.e., a low-pass filter circuit comprising resistors 45a, 45c and capacitors 45b, 45d. This suppresses variation in the DC voltage Vcc fed to the constant-voltage circuit 40. Therefore, the constant-voltage circuit 40 generates a further stabilized reference voltage Vref.

Figure 5:
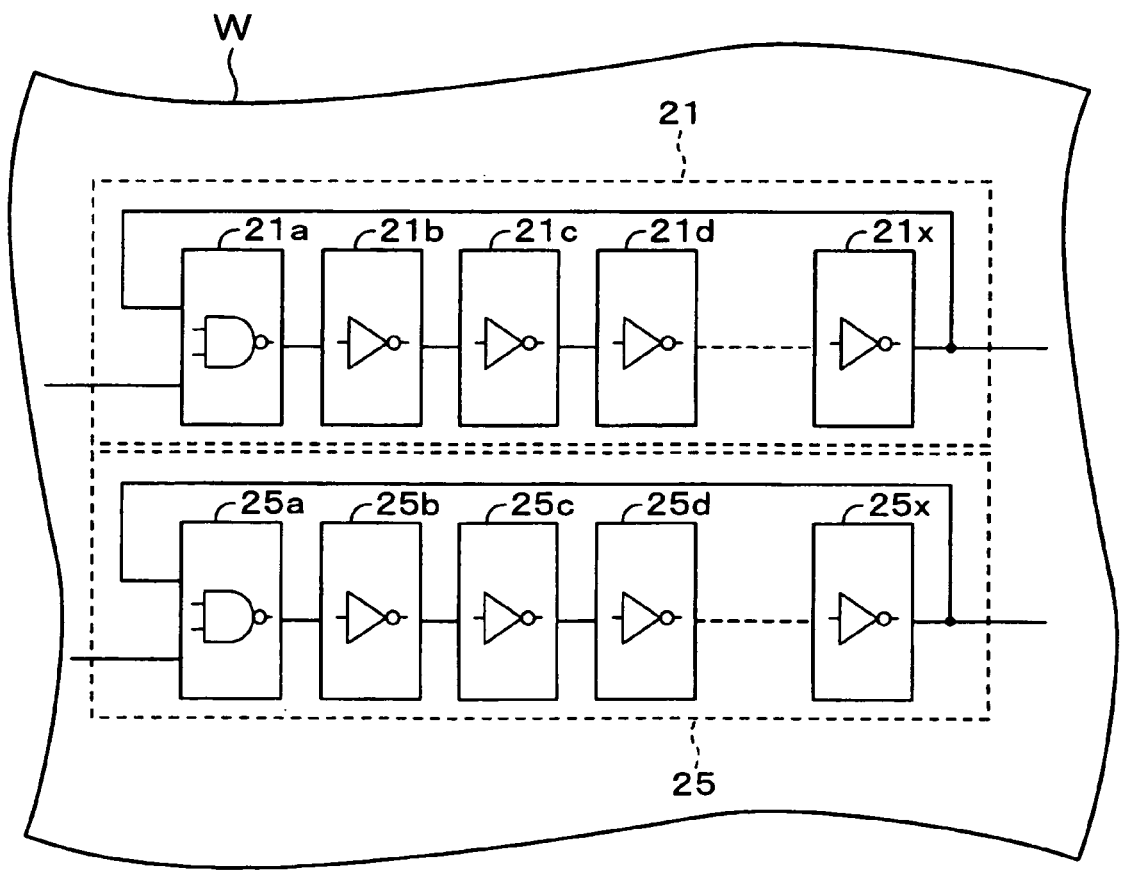
FIG. 5 is a circuit diagram showing a first ring delay line and a second ring delay line shown in FIG. 1 on a semiconductor substrate.

Further, the second ring delay line 25 is formed so as to be thermally coupled to the first ring delay line 21. For example, as shown in FIG. 5, the first ring delay line 21 and the second ring delay line 25 are arranged adjacent and in parallel on a same semiconductor substrate W. It is therefore made possible to decrease the characteristic-dispersing factors caused by the semiconductor processing such as photo etching among the characteristic-dispersing factors of the transistors forming the NAND circuit 21a and INV circuits 21b, 21c, 21d to 21x in the first ring delay line 21.

Therefore, the delay characteristics due to the NAND circuit 21a and INV circuits 21b, etc. in the first ring delay line 21 can be brought nearly in agreement with the delay characteristics due to the NAND circuit 25a and INV circuits 25b, etc. in the second ring delay line 25, contributing to improving the pair characteristics. Upon adjoining them together, further, the temperature conditions due to the generation of heat can be uniformed or equalized for the two circuits to effectively cancel the temperature characteristics.

The second counter 26 has a function for counting the number of times of circulation of the pulse signal circulating in the second ring delay line 25 and for outputting the counted value, and its input terminal is connected to the output terminal of the INV circuit 25x of the second ring delay line 25 and its output terminal is connected to the input terminals of the digital comparator 28 and of the second latch 27. Further, a reset signal line 20e is connected to a reset terminal since the counted value must be initialized by a reset signal RST input from an external unit.

Therefore, the counted value of the second counter 26 is reset by the rising edge (or falling edge) of the reset signal RST input from the reset signal line 20e, by the start signal STR, the counter starts counting the number of times of circulation of the pulse signal circulating in the second ring delay line 25, and the number of times of circulation counted from moment to moment is output as a counted value to the digital comparator 28.

The second latch 27 has a function for outputting the counted value output from the second counter 26 as a digital data of the reference voltage Vref to a reference data line 20f at a time point (predetermined time point) of a rising edge (or falling edge) of the latch signal, and operates as converted data output control means. Like the data output from the first latch 24, the digital data of the reference voltage Vref operates as a most significant 14 bits M14 among the 18 bits which are the remainder of the binary digital data DT.

Namely, the output terminal of the second counter 26 is connected to the input terminal of the second latch 27, and the digital comparator 28 that will be described below is connected thereto to input the latch signal. Therefore, the data of the counter value input from the second counter 26 is latched at the rising time point of the latch signal and is output to the reference data line 20f. That is, the data of counter value of the second counter 26 is output as the digital data of the reference voltage Vref from the reference data line 20f.

As the counted value output from the second counter 26 reaches a predetermined value (e.g., 255 of decimal notation) read from the ROM 29, the digital comparator 28 operates to output the latch signal to the latch and encoder 22, to the first latch 24 and to the second latch 27. Therefore, the digital comparator operates as time point notifying means. In the first embodiment, the latch signal is output to the latch and encoder 22 via the LPF 30 and the output buffer 32. However, the latch signal may be directly output to the latch and encoder 22, etc. The ROM 29 stores the predetermined value in advance.

Here, the digital comparator 28 will be described with reference to FIGS. 3 and 4. The data output from the second counter 26 and the ROM 29 are all presumed to be formed by 8 bits.

Figure 3:
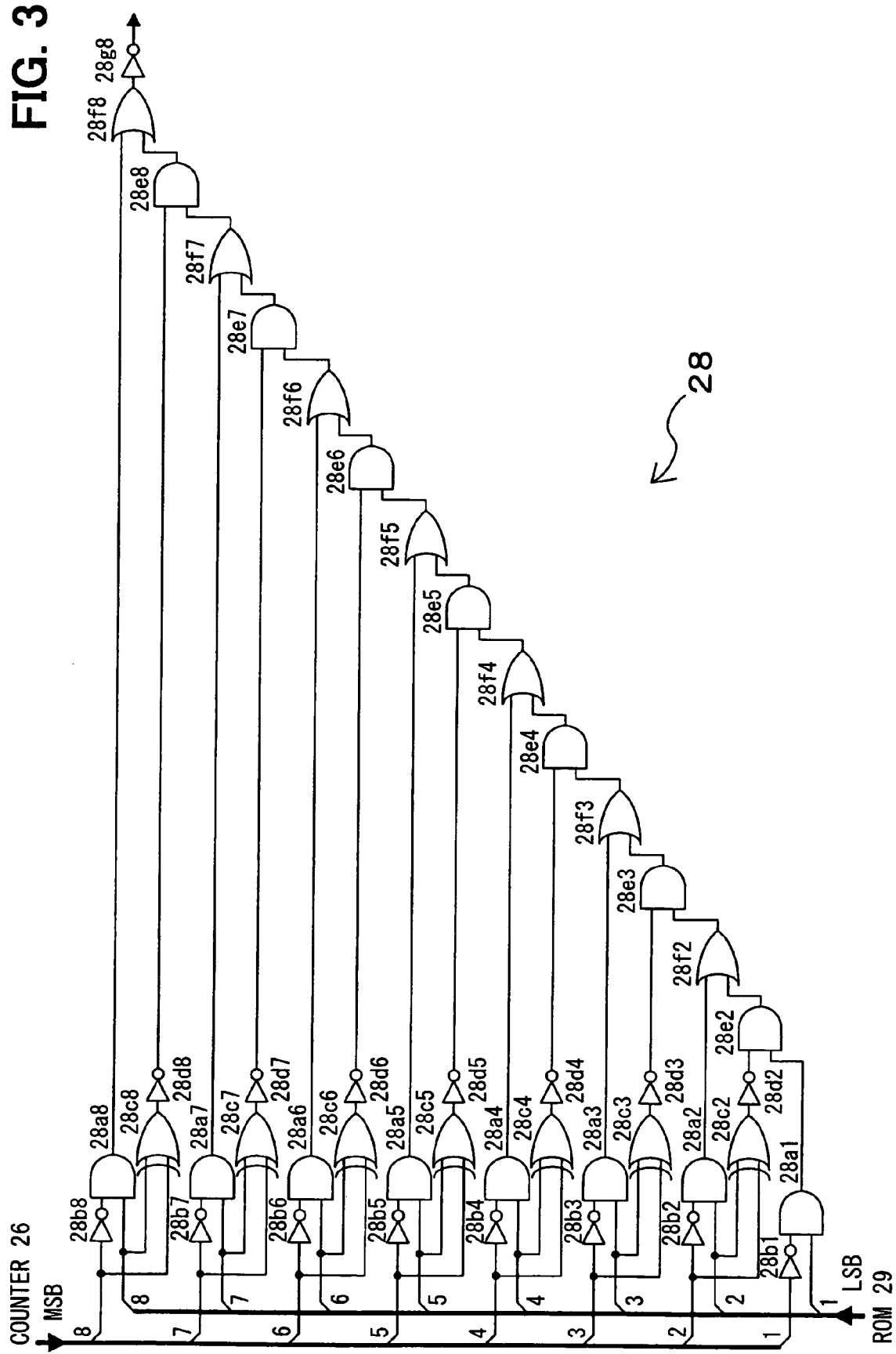
FIG. 3 is a circuit diagram of one example of a digital comparator shown in FIG. 1.

Referring to FIG. 3, the digital comparator 28 is formed by a plurality of AND circuits 28a1, 28a2, 28a3, 28a4, 28a5, 28a6, 28a7, 28a8, 28e2, 28e3, 28e4, 28e5, 28e6, 28e7, 28e8, INV circuits 28b1, 28b2, 28b3, 28b4, 28b5, 28b6, 28b7, 28b8, 28d2, 28d3, 28d4, 28d5, 28d6, 28d7, 28d8, 28g8, exclusive-OR (EXOR) circuits 28c2, 28c3, 28c4, 28c5, 28c6, 28c7, 28c8, and OR circuits 28f2, 28f3, 28f4, 28f5, 28f6, 28f7 and 28f8. This is to output the latch signal from the digital comparator 28 not only when the counted value output from the second counter 26 reaches a predetermined value read out from the ROM 29 but also when the counted value becomes greater than the predetermined value.

If, for example, if an n-th bit of the data output from the ROM 29 is denoted by An and the n-th bit of the data output from the second counter 26 is denoted by Bn, then a latch signal Z (=Zn¬) output from the digital comparator 28 is expressed by Zn=An•Bn¬+(An^Bn)¬•Z(n−1), and Zi=Ai•Bi¬+(Ai^Bi)¬•Z(i−1). If i=1, then Z1=A1•B1¬. Here, "•" denotes a logical product (AND), "+" denotes a logical sum (OR), "^" denotes an exclusive OR, and "¬" denotes the inverted logic of a logical expression or a value that is just preceding. Though the notation is different, the logical expression has the same meaning as the following expression 1, where the least significant first bit is $Z1 = A1 \cdot \overline{B1}$.

$$Zn = \overline{An \cdot \overline{Bn} + \overline{(An \oplus Bn)} \cdot Z(n-1)}$$

That is, (1) Ai•Bi¬=0 if an i-th bit of the data output from the second counter 26 is smaller than the i-th bit of the data output from the ROM 29 (Ai>Bi), or (2) (Ai^Bi)¬•Z(i−1)=0 if the i-th bit of the data output from the second counter 26 is not in agreement with the i-th bit of the data output from the ROM 29 ((Ai^Bi)¬=0) or if there is no carry Z(i−1) of the least significant bit (Z(i−1)=0). If the latch signal Z (=Zi¬) is output, therefore, (Ai≦Bi) holds if the i-th bit of the data output from the second counter 26 inclusive of the carry of the least significant bit is larger than the i-th bit of the data output from the ROM 29 (Ai≦Bi).

For example, the most significant (MSB) eighth bit realizes A8•B8¬ through the AND circuit 28a8 and INV circuit 28b8, and realizes (A8^B8)¬ through the EXOR circuit 28c8 and INV circuit 28d8. Since the carry of the seventh bit which is a least significant bit is Z7, (A8^B8)¬ and Z7 are input to the AND circuit 28e8 so that their logical AND can be operated, and the logical ADD of the output thereof and of the preceding output A8•B8¬is input to the OR circuit 28f8. The output of the OR circuit 28f8 is inverted by the INV circuit 28g8 to output a latch signal Z (=Z8¬).

Similarly, the seventh bit realizes A7•B7¬ through the AND circuit 28a7 and INV circuit 28b7, and realizes (A7^B7)¬ through the EXOR circuit 28c7 and INV circuit 28d7. Since the carry of the sixth bit which is a least significant bit is Z6, (A7^B7)¬ and Z6 are input to the AND circuit 28e7 so that their logical AND can be operated, and the logical OR of the output thereof and of the preceding output A7•B7¬is input to the OR circuit 28f7.

Similarly hereinafter, the sixth bit to the second bit realize A6•B6¬ to A2•B2¬ through the AND circuits 28a6 to 28a2 and INV circuits 28b6 to 28b2, and realizes (A6^B6)¬ to (A2^B2)¬ through the EXOR circuits 28c6 to 28c2 and INV circuits 28d6 to 28d2. Since the carries of the fifth bit to the first bit which are least significant bits are Z5 to Z1, (A6^B6)¬ to (A2^B2)¬ and Z5 to Z1 are input to the AND circuits 28e6 to 28e2, respectively, so that their logical product can be operated, and the logical sum of the outputs thereof and of the preceding outputs A6•B6¬ to A2•B2¬ are input to the OR circuits 28f6 to 28f2.

The least significant (LSB) first bit realizes A1•B1¬ through the AND circuit 28a1 and INV circuit 28b1, and inputs the output thereof as a carry to the AND circuit 28e2 of the most significant second bit.

Similarly, the fourth bit realizes A6•B6¬through the AND circuit 28a6 and INV circuit 28b6, and realizes (A6^B6)¬ through the EXOR circuit 28c6 and INV circuit 28b6. Since the carry of the fifth bit which is a least significant bit is Z5, (A6^B6)¬ and Z5 are input to the AND circuit 28e6 so that their logical AND can be operated, and the logical ADD of the output thereof and of the preceding output A6•B6¬is input to the OR circuit 28f6.

By forming the logical circuit of the digital comparator 28 as described above, it is allowed to detect if the counted value output from the second counter 26 has exceeded the predetermined value (e.g., 255 of the decimal notation) read out from the ROM 29. If the predetermined value is exceeded, therefore, the latch signal Z (=Zn¬) is shifted to "0→1" (Lo→Hi) to notify the predetermined time point to the latch and encoder 22, first latch 24 and second latch 27.

Figure 4:
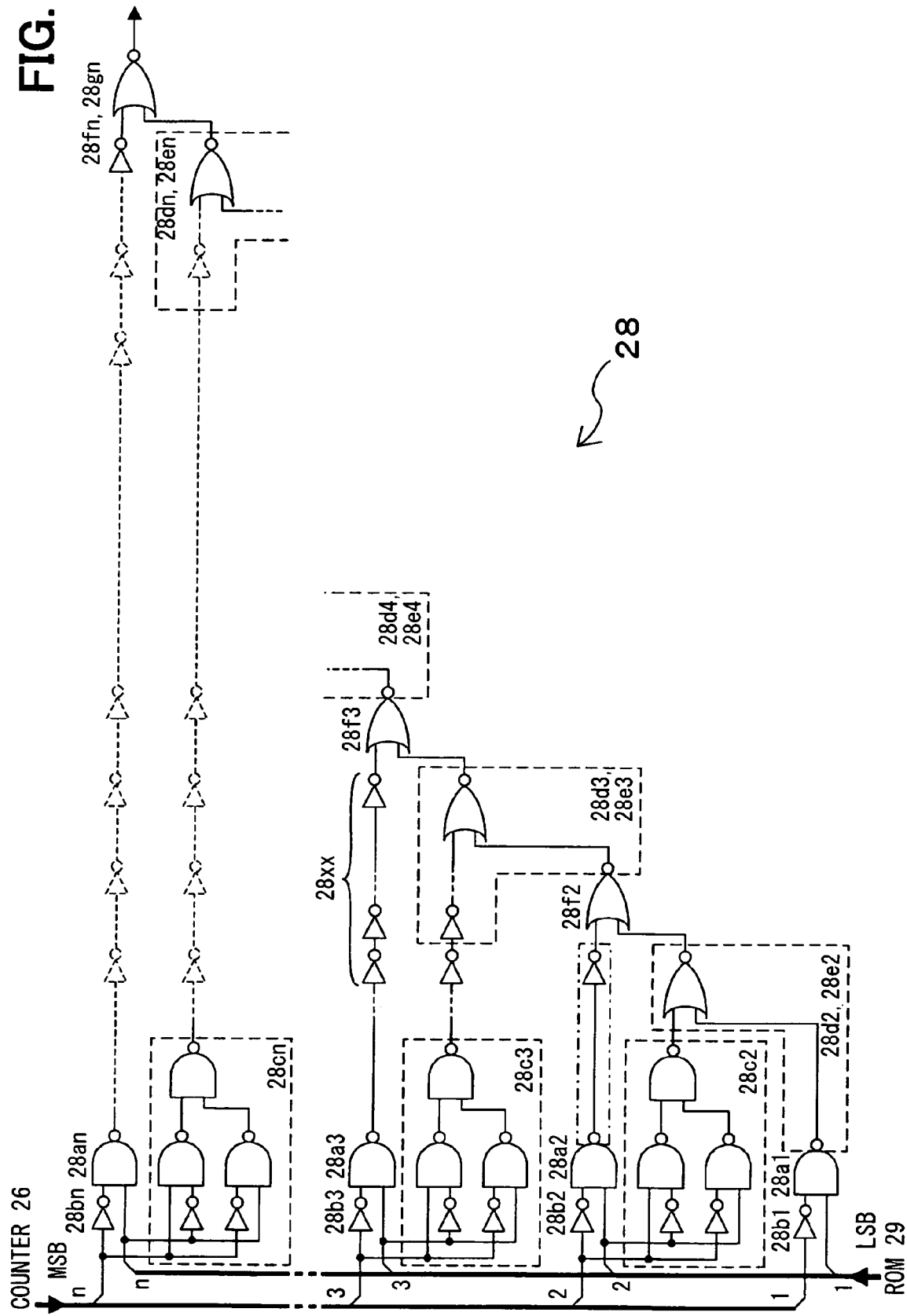
FIG. 4 is a circuit diagram of another example of the digital comparator shown in FIG. 1.

The circuit configuration of the digital comparator 28 shown in FIG. 3 can be replaced by a different configuration (digital comparator 28) shown in FIG. 4. That is, according to the De Morgan's rule, there holds A•B=(A¬+B¬)¬. Therefore, the logic circuit formed by, for example, the AND circuit 28d2 and INV circuit 28e2, and the logic circuit formed by the AND circuit 28d3 and INV circuit 28e3, can be replaced by the NOR circuits and INV circuits.

Further, since A^B=((A•B¬)¬)•((A¬•B)¬))¬ the EXOR circuit can be replaced by three NAND circuits and two INV circuits. Therefore, the digital comparator 28 shown in FIG. 3 can also be formed as a digital comparator 28' shown in FIG. 4.

A plurality of INV circuits 28xx connected in series as shown in FIG. 4 are for adjusting the delay time at the gates (AND circuits 28a1, 28a2, 28a3, 28a4, 28a5, 28a6, 28a7, 28a8, 28e2, 28e3, 28e4, 28e5, 28e6, 28e7, 28e8, INV circuits 28b1, 28b2, 28b3, 28b4, 28b5, 28b6, 28b7, 28b8, 28d2, 28d3, 28d4, 28d5, 28d6, 28d7, 28d8, 28g8, EXOR circuits 28c2, 28c3, 28c4, 28c5, 28c6, 28c7, 28c8, and OR circuits 28f2, 28f3, 28f4, 28f5, 28f6, 28f7, 28f8). These circuits are interposed in pairs among the logic circuits to lower the glitch noise generated due to a slight deviation in the time point for shifting the states Hi→Lo or Lo→Hi.

The LPF 30 is a low-pass filter circuit formed by a resistor 30a and a capacitor 30b, and permits the passage of frequency components lower than a predetermined cut-off frequency but blocks the passage of frequency components higher than the predetermined frequency. In the first embodiment, the cut-off frequency is set to be corresponded to, for example, the rising frequencies of glitch noise (e.g., of the order of about several tens of MHz to about hundreds of MHz) so as to remove the glitch noise. The LPF 30 operates as a filter circuit.

The output buffers 32 and 33 are each formed by connecting a set of two INV circuits in series, and operate to adjust the output time point and to maintain driving capability for the succeeding stages. The output buffer 33 is provided for outputting a latch completion signal to a latch signal line 20g for notifying the completion of the latch signal to the external unit.

By forming the A/D converter circuit 20 of the first embodiment as described above, the digital data DT obtained by binary-converting the analog input voltage Vin input to the input line 20a is not only output from the output line 20b but is also output from the reference data line 20f as a digital data of the reference voltage Vref, that is, the data of counter value of the second counter 26 is output. Therefore, the second ring delay line 25 receives a predetermined reference voltage Vref as the power supply voltage, while counting the number of times of circulation of the pulse signal circulating in the second ring delay line 25 under nearly the same temperature environment as the first ring delay line 21. Therefore, a latch signal is output (notified) to the latch and encoder 22 and to the first latch 24 at a time point at which the predetermined value is reached as the predetermined time point. Thus, the binary digital data DT at this latch time point can be obtained from the latch and encoder 22 and the first latch 24.

That is, since the first ring delay line 21 and the second ring delay line 25 similarly vary their output characteristics depending upon a change in the ambient temperature, it is allowed to cancel the temperature characteristics of the first ring delay line 21 by the temperature characteristics of the second ring delay line 25. On the other hand, the analog voltage input to the second ring delay line 25 is a reference voltage Vref output from the constant-voltage circuit 40 which is almost free of temperature variation, and does not fluctuate. By calculating a differential data between the digital data DT output from the latch and encoder 22 and the first latch 24 through the output line 20b and the digital data (predetermined value) based on the predetermined reference voltage Vref output from the second latch 27 via the reference data line 20f, therefore, it is possible to obtain a digital data corresponding to a difference of the analog voltage from the reference voltage Vref.

By operating the difference between the 18-bit digital data DT output from the output line 20b and the 14-bit digital data that operates as the most significant 14-bits of the digital data DT and output from the reference data line 20f through a logical arithmetic circuit 50 provided outside the A/D converter circuit 20, therefore, it is possible to obtain the digital data suppressing variation caused by a change in the ambient temperature from a TAD output line 50a without executing a complex calculation operation. Since the two data have different bit numbers, the operation of difference, i.e., the subtraction processing is executed by regarding the least significant 4 bits of the digital data output from the reference data line 20f to be all 0 (zero).

That is, in the A/D converter circuit 20, the delay characteristics of the first ring delay line 21 and of the second ring delay line 25 similarly vary depending upon a change in the ambient temperature and, therefore, the temperature characteristics of the first ring delay line 21 can be canceled by the temperature characteristics of the second ring delay line 25. Since the reference voltage Vref output from the constant-voltage source 40 which is almost free of temperature change is fed as a power supply voltage to the second ring delay line 25, it is made possible to obtain a digital data from the TAD output line 50a suppressing variation caused by a change in the ambient temperature by calculating a differential data between the digital data DT output from the output line 20b and the digital data of the reference voltage Vref output from the reference data line 20f through the logical arithmetic circuit 50, without the need of executing a complex operation.

The operation of difference by the logical arithmetic circuit 50 may be executed in the A/D converter circuit 20. It is therefore made possible to obtain the digital data from the TAD output line 50a suppressing variation caused by a change in the ambient temperature without providing the operation circuit on the outer side.

By latching the counter value of the second counter 26 by the second latch 27 and outputting it onto the reference data line 20*f* as described above, a correct counter value counted by the second counter 26 can be used for the differential operation by the logical arithmetic circuit 50. Instead of providing the second latch 27 and the reference data line 20*f*, further, a value which is the same as the predetermined value stored in the ROM 29 may be directly subtracted through the logical arithmetic circuit 50. This simplifies the circuit construction.

As described above, further, the digital comparator 28 is so formed as to produce a latch signal if the counted value of the second counter 26 has exceeded the predetermined value stored in the ROM 29. However, the digital comparator 28 may be so formed as to produce a latch signal if the counted value of the second counter 26 has become in agreement with the predetermined value stored in the ROM 29. This makes it possible to simplify the configuration of the logic circuit of the digital comparator since a carry from the least significant bit does not have to be taken into consideration.

Figure 7:
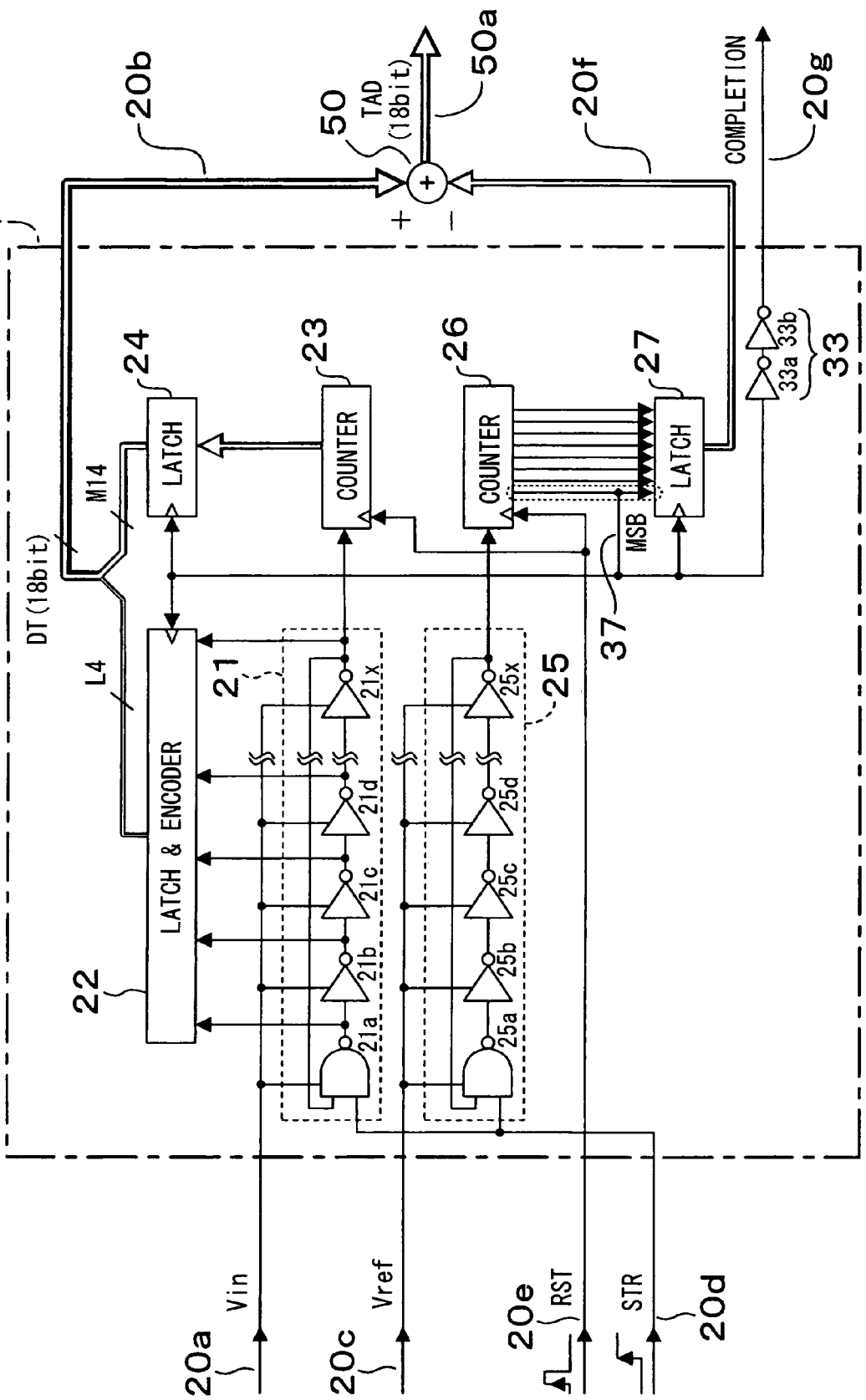
FIG. 7 is a circuit diagram showing another example of the A/D converter circuit according to the first embodiment of the invention.

Referring to FIG. 7, the latch signal may be output to the latch and encoder 22, first latch 24 and second latch 27 based on the data of a bit line (inside a broken line in FIG. 7) of a particular bit, e.g., the most significant bit (MSB) of the second counter 26.

That is, instead of providing the digital comparator 28, ROM 29, LPF 30 and output buffer 32, the bit line of the most significant bit of the second counter 26 is input to the latch signal input terminals of the latch and encoder 22, first latch 24 and second latch 27. Further, the same bit line is connected to the input side of the output buffer 33. If the logical value of the bit line of the most significant bit varies like Lo→Hi due to the count-up of the second counter 26, therefore, the logical value is output as a latch signal to the latch and encoder 22, etc. Therefore, this circuit configuration enables the A/D converter circuit 20 to be simplified.

Second Embodiment

Figure 8:
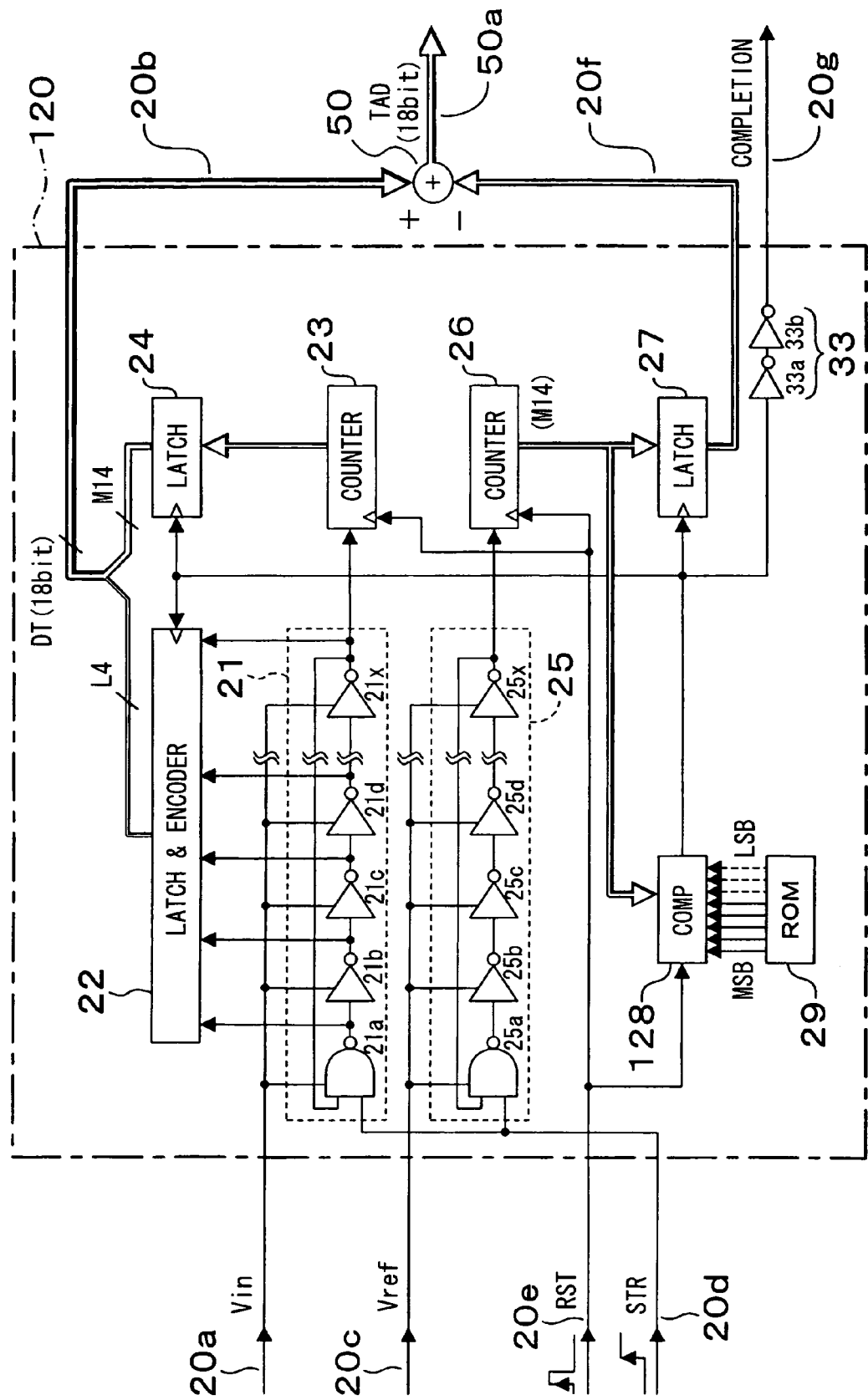
FIG. 8 is a circuit diagram showing an A/D converter circuit according to a second embodiment of the invention.

An A/D converter circuit 120 according to a second embodiment is shown in FIG. 8. The A/D converter circuit 120 is different from the A/D converter circuit 20 with respect to that the configuration of the digital comparator 28 is varied and the LPF 30 is omitted. Therefore, the constituent portions substantially the same as those of the A/D converter circuit 20 of the first embodiment are denoted by the same reference numerals.

Figure 9:
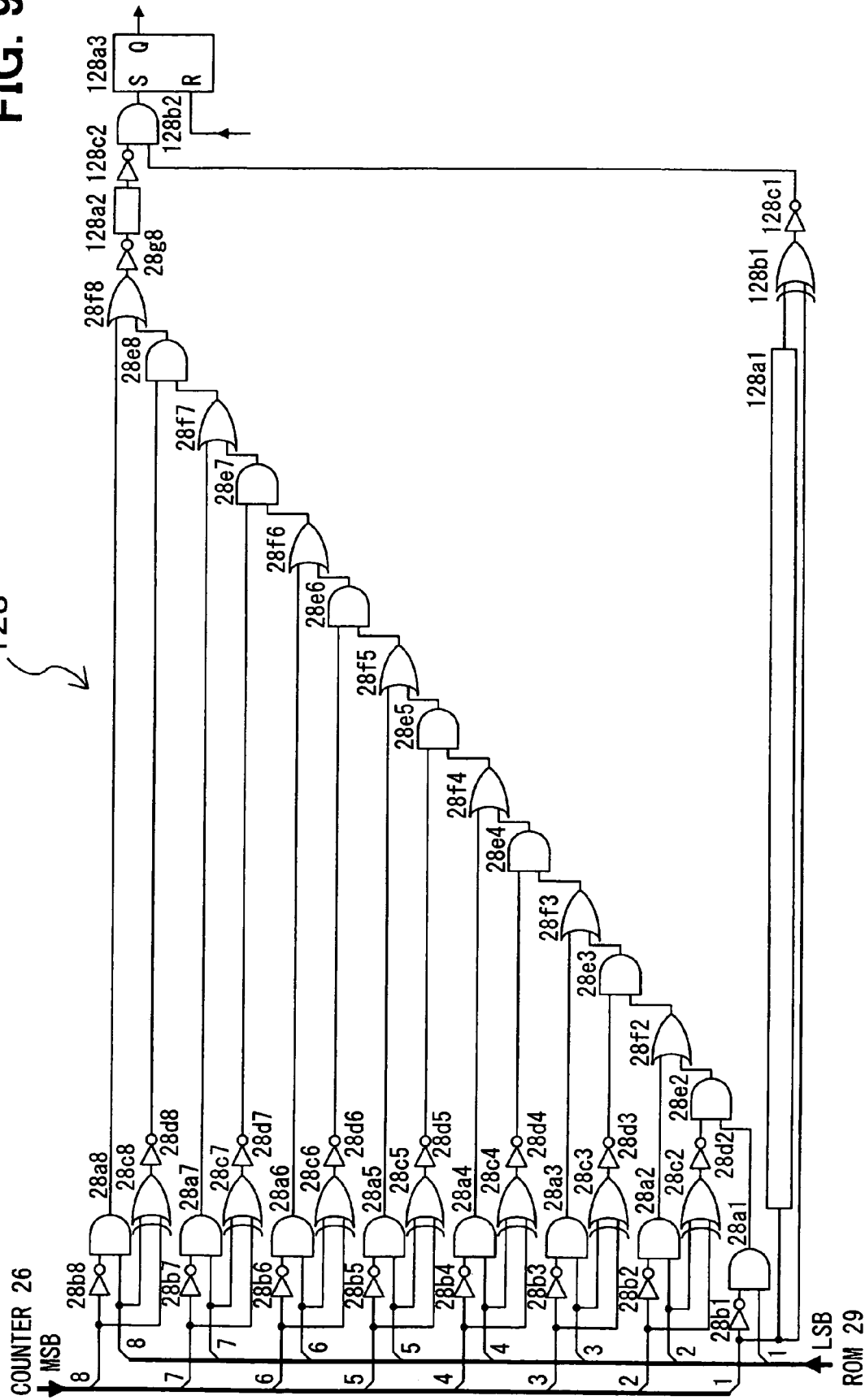
FIG. 9 is a circuit diagram of one example of a digital comparator shown in FIG. 8.

The A/D converter circuit 120 is formed without providing the LPF 30 between the digital comparator 128 and the second latch 27. That is, as shown in FIG. 9, a delay circuit 128*a*1, an EXOR circuit 128*b*1, a flip-flop circuit 128*a*3, etc. are provided as compared to the digital comparator 28 of the first embodiment shown in FIG. 3. That is, despite the glitch noise, if the counter value output from the second counter 26 reaches the predetermined value, a time is provided as a masking time which is longer than a maximum delay time which is required by the most significant (MSB) 8-bit to change from "0" to "1" after the counted value is input to the digital comparator 128, and after the passage of the masking time, a data of change related to the eighth bit that changes from "0" to "1" is output to prevent the glitch noise that occurs from being output.

Specifically as shown in FIG. 9, the least significant (LSB) first bit from the second counter 26 is input to a delay circuit 128*a*1 in addition to an INV circuit 28*b*1 and is, further, input to one input of an EXOR circuit 128*b*1. The output of the delay circuit 128*a*1 is input to another input of the EXOR circuit 128*b*1, and the output of the EXOR circuit 128*b*1 is input to an INV circuit 128*c*1. There is thus formed a determination circuit capable of outputting "1" to the INV circuit 128*c*1 after the elapse of a maximum delay time in which the glitch noise is likely to occur. There is, further, formed a notifying circuit for notifying the fact (latch signal) that the counter value has reached the predetermined value if the output of the INV circuit 28*g*8 and the output of the determination circuit become both "1", the INV circuit 28*g*8 producing "1" after the counted value has reached the predetermined value through a delay circuit 128*a*2 like in the first embodiment.

The delay circuit 128*a*1 is so formed as to be delayed by longer than the longest delay time for comparing the counter value input from the second counter 26 with the data output from the ROM 29, i.e., to be longer than the delay time of when there are the largest number of gates to be compared. In the case of the above digital comparator 28, a plurality of NAND circuits and a plurality of NOR circuits are connected in an even number in series to correspond to the NAND circuits on the output sides of the INV circuit 28*b*1, AND circuit 28*a*1 and EXOR circuit 28*c*2 like the delay circuit 128*a*1 in the digital comparator 128 shown in FIG. 10. The connection in an even number is for preventing the inversion of logic between the input and the output.

Figure 10:
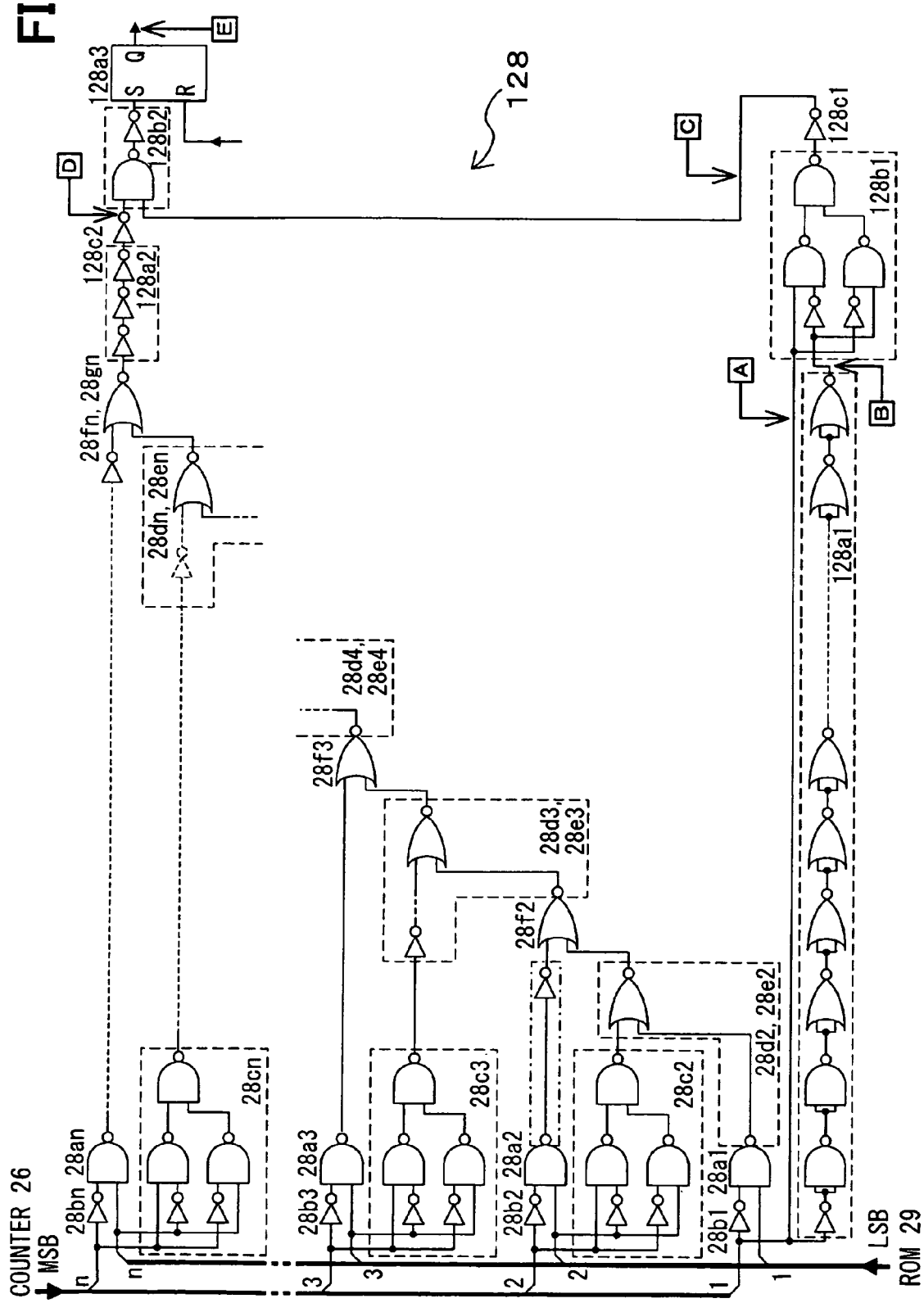
FIG. 10 is a circuit diagram of another example of the digital comparator shown in FIG. 9.
Figure 11:
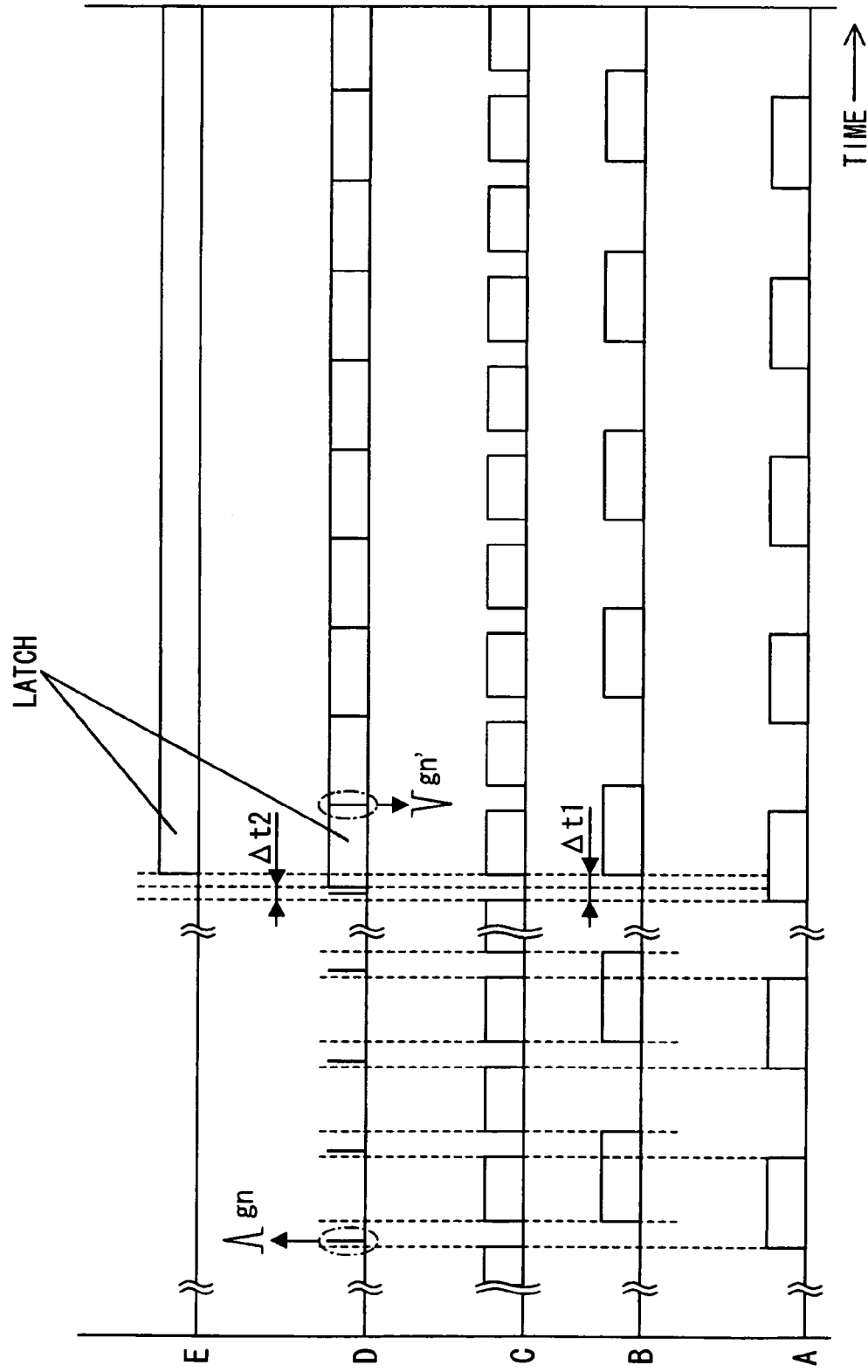
FIG. 11 is a time chart showing an operation of the digital comparator shown in FIG. 10.

As represented by the waveforms at points A and B in FIG. 11, therefore, the data of the least significant (LSB) first bit of the counter value input from the second counter 26 develop a difference of delay time Δt1 between a signal (point A in FIG. 10) directly input to the EXOR circuit 128*b*1 and a signal (point B in FIG. 10) input to the EXOR circuit 128*b*1 via the delay circuit 128*a*1. Therefore, to the EXOR circuit 128*b*1, there are input the signal (present data of the least significant bit) that has arrived in real time and the signal (past data of the least significant bit) that has arrived in the past by the delay time Δt1. Therefore, only when the two inputs are in agreement as determined by the determination circuit formed by the EXOR circuit 128*b*1 and the INV circuit 128*c*2, "1" is output (point C in FIG. 10) from the INV circuit 128*c*1 as represented by a waveform at the point C in FIG. 11. That is, "0" is output from the INV circuit 128*c*1 for only the delay time Δt1.

Here, as represented by a waveform at a point D in FIG. 11, the output (point D in FIG. 10) of the digital comparator 28 of the first embodiment can produce the glitch noise gn prior to producing a latch signal that represents the agreement of the counter value input from the second counter 26 and the data output from the ROM 29. Therefore, an AND circuit 128*b*2 is provided as a circuit for masking the output of latch signal for only a period in which the glitch noise gn is output.

That is, as shown in FIG. 9, an AND circuit 128*b*2 is provided to output a latch signal when both the output of the INV circuit 28*g*8 corresponding to the output of the digital comparator 28 of the first embodiment and the output of the determination circuit formed by the EXOR circuit 128*b*1 and the INV circuit 128*c*1 become "1". Between the INV circuit 28*g*8 and the AND circuit 128*b*2, further, there is provided the delay circuit 128*a*2 that delays by an amount corresponding to a delay time Δt2 due to the EXOR circuit 128*b*1. Therefore, the output of the INV circuit 28*g*8 is masked by the delay time Δt1 without being affected by the delay time Δt2 due to the EXOR circuit 128*b*1.

Further, a flip-flop circuit 128*a*3 is provided on the output side of the AND circuit 128*b*2 to hold a latch signal that is output. As represented by waveforms at points D and E in FIG. 11, therefore, the latch signal output from the AND circuit 128b2 is held by the flip-flop circuit 128a3 preventing the fluttering of the latch signal that is masked for the delay time Δt1 of the AND circuit 128b2 (point E in FIG. 10). The reset signal line 20e is connected to the reset terminal of the flip-flop circuit 128a3 to initialize the state of the flip-flop circuit 128a3.

By forming the A/D converter circuit 120 of the second embodiment as described above, the predetermined time point due to the latch signal output from the AND circuit 128b2 is a moment at which the data (past data) of the first bit (least significant bit) input to the delay circuit 128a1 the delay time Δt1 before and output from the delay circuit 128a1 the delay time Δt1 after" is in agreement with "the data (present data) of the first bit (least significant bit) of the present counter value output from the second counter 26". Therefore, the glitch noise gn that occurs among the gates (AND circuits 28a1, 28a2, 28a3, 28a4, 28a5, 28a6, 28a7, 28a8, 28e2, 28e3, 28e4, 28e5, 28e6, 28e7, 28e8, INV circuits 28b1, 28b2, 28b3, 28b4, 28b5, 28b6, 28b7, 28b8, 28d2, 28d3, 28d4, 28d5, 28d6, 28d7, 28d8, 28g8, EXOR circuits 28c2, 28c3, 28c4, 28c5, 28c6, 28c7, 28c8, and OR circuits 28f2, 28f3, 28f4, 28f5, 28f6, 28f7, 28f8) can be masked by the AND circuit 128b2 for the delay time Δt1.

The delay circuit 128a1 and the AND circuit 128b2 can be formed by, for example, logic circuits such as NOR circuit, NAND circuit and INV circuit as shown in FIG. 10, making it possible to remove the glitch noise without using capacitors as compared to the case of using the LPF 30 of the first embodiment. When the digital comparator 128 is formed, for example, on a semiconductor substrate, therefore, the circuit scale and the area on a plane can be decreased as compared to when the digital comparator 28 and the LPF 30 are combined together in the first embodiment.

Third Embodiment

Figure 12:
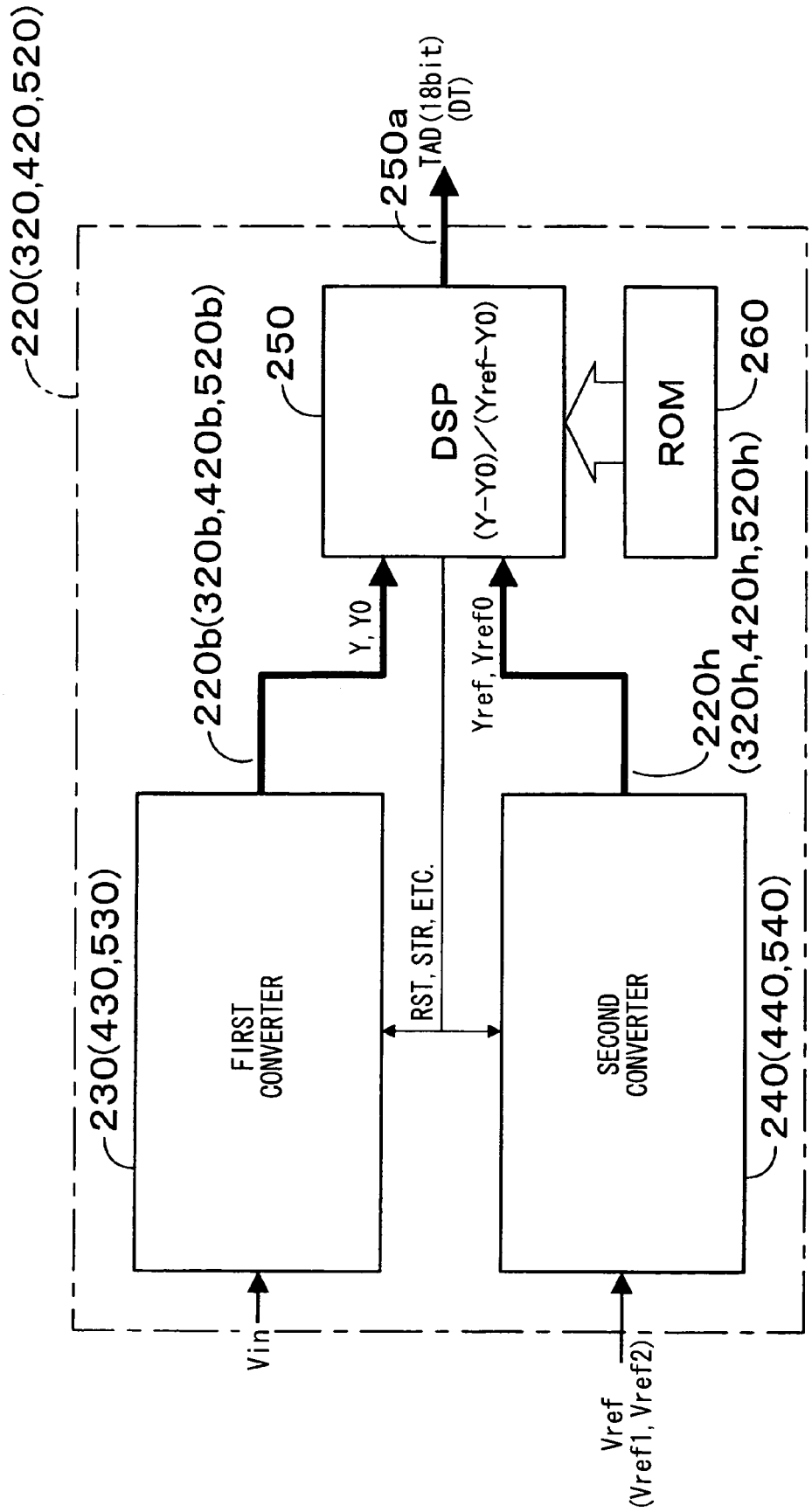
FIG. 12 is a block diagram showing an A/D converter circuit according to third to sixth embodiments of the invention.

An A/D converter circuit 220 according to a third embodiment is shown in FIG. 12. In the A/D converter circuit 20 of the first embodiment and in the A/D converter circuit 120 of the second embodiment, the number of times of circulation of the pulse signal circulating in the second ring delay line 25 under nearly the same temperature environment as that of the first ring delay line 21 is counted, a latch signal is output to the latch and encoder 22 and to the first latch 24 at a time point at which the counted value reaches a predetermined value as a predetermined time point, and a binary digital data DT at the latch time point is produced from the latch and encoder 22 and from the first latch 24. In the A/D converter circuit 220 according to the third embodiment, however, the latch signal is applied as a sampling clock CLK and as shown in FIG. 12, a first digital data Y output from a first converter unit 230 is corrected (Y−Y0)/(Yref−Y0) by a DSP 250 based on a second digital data Yref output from a second converter unit 240.

The first converter unit 230 and the second converter unit 240 are partly formed substantially in the same manner as the A/D converter circuit 20 of the first embodiment. Therefore, these portions are denoted by the same reference numerals and their description is not repeated.

In the A/D converter circuit 20 of the above first embodiment as shown in FIG. 6B, a reference voltage Vref is set to be 3.5 V which is nearly at the center (intermediate) of a range where the temperature correction can be effected so that the value of the digital data DT varies at the same ratio despite the ambient temperature varies over −35° C. to +85° C., and the reference voltage Vref is used as the power supply voltage for the second ring delay line 25 making it possible to produce a digital data from the TAD output line 50a suppressing the variation caused by a change in the ambient temperature as described above.

Figure 13A:
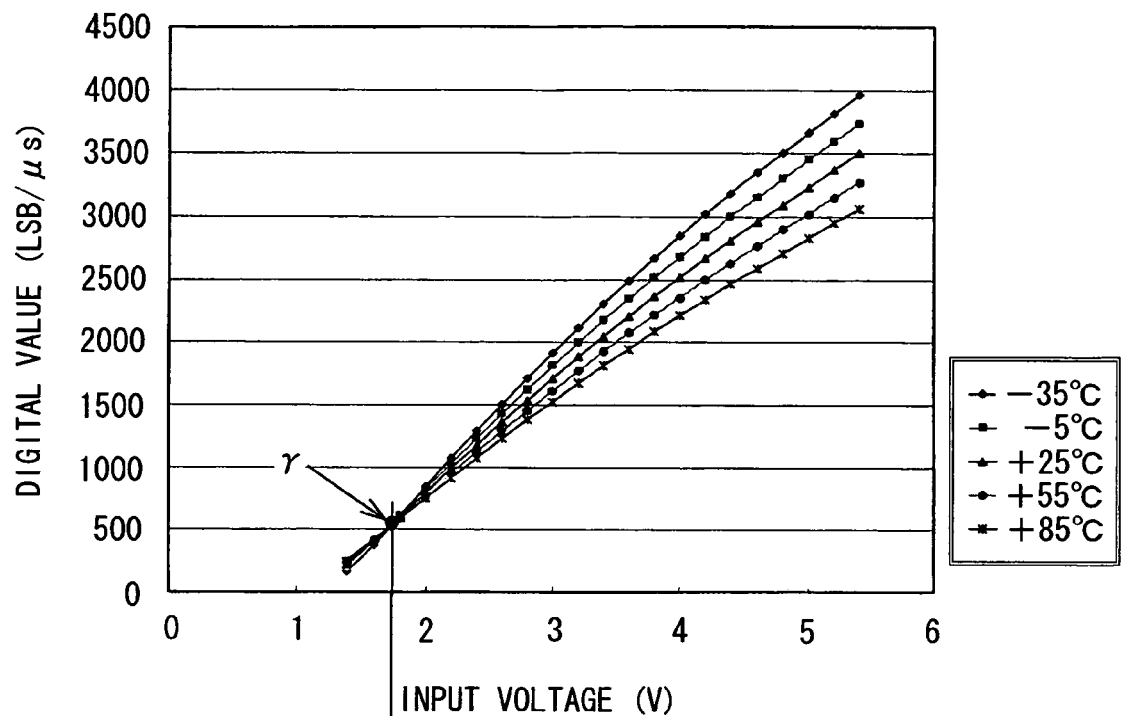
FIGS. 13A and 13B are graphs showing changes in a TAD output value (converted value) relative to a voltage input to the A/D converter circuit depending upon temperature according to the third embodiment, and showing variation ratios (converted value ratios) of temperature characteristics shown in FIG. 13A with +25° C. as a reference, respectively.
Figure 13B:
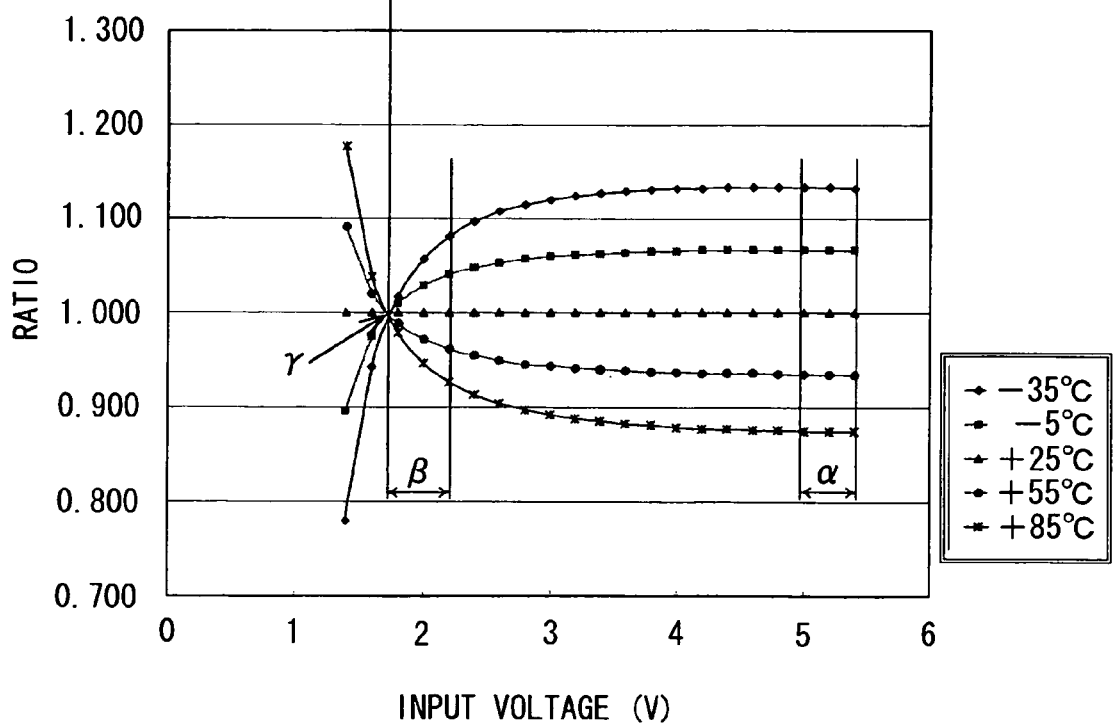

However, the range where the temperature can be corrected is limited to a range a where the temperature characteristics remain constant as shown in FIG. 13B. Therefore, the above temperature correction cannot be applied to other ranges and, particularly, to a range β where the temperature characteristics vary sharply. According to the third embodiment, therefore, attention is given to a relationship (FIG. 13A) between the input voltage Vin at a point γ where the temperature characteristics become 0 (zero) (point where the characteristic lines meet together at each of the temperatures) in FIG. 13B and the first digital data, and the temperature is corrected in the range β, too, by executing a predetermined operation from the relationship shown in FIG. 14.

Figure 14:
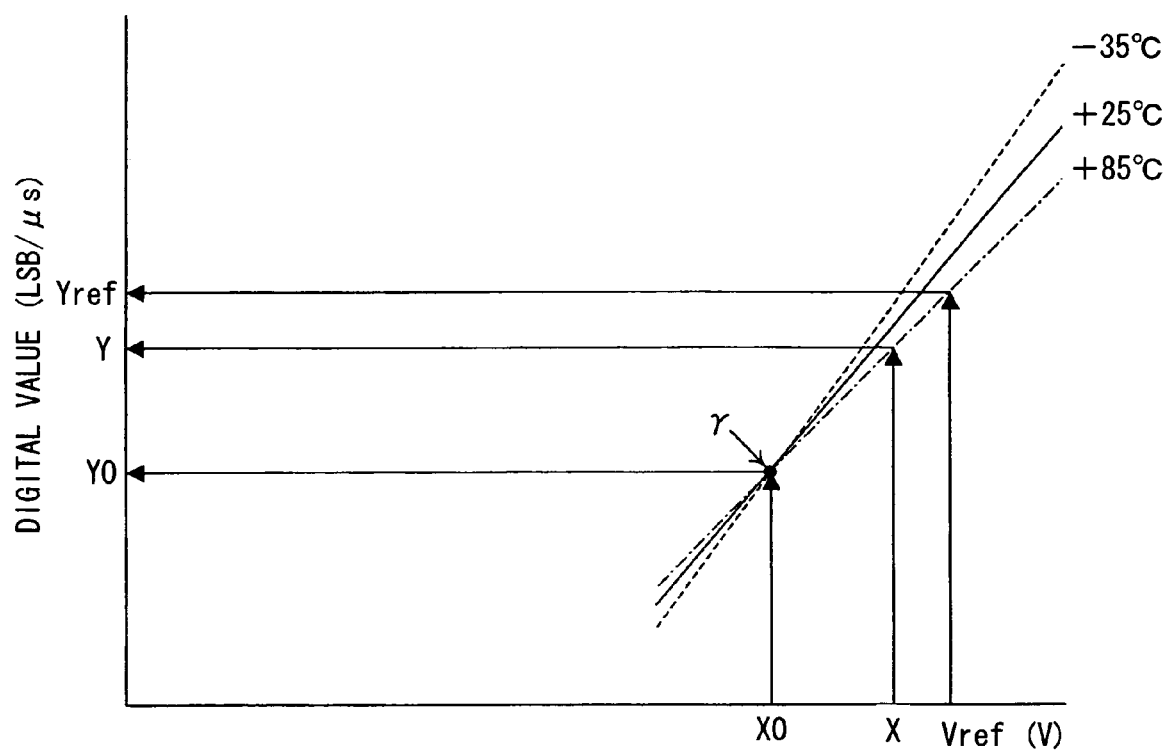
FIG. 14 is a graph showing changes in a TAD output value (converted value) depending upon a temperature relative to the voltage input to the A/D converter circuit according to the third embodiment.

Specifically, as shown in FIG. 14, the ambient temperature of the first converter unit 230 is set to be, for example, −35° C., +25° C. and +85° C., the first digital data are obtained for the input voltages Vin of each of the cases, and the point γ where the temperature characteristics become 0 (zero) is found from a point where the three characteristic lines (−35° C.: broken line, +25° C.: solid line, +85° C.: dot-dash chain line) meet together. In the characteristic diagram of FIG. 14, the abscissa represents the input voltage Vin and the ordinate represents the digital value [LSB/μs].

A first digital data Y0 (=Y0×t; t is a sampling period [μs] which is hereinafter referred to as "digital data Y0 of zero temperature characteristic") for the input voltage Vin (X0) at the point γ is found and is stored in a ROM 260 to correct (Y−Y0)/(Yref−Y0) the first digital data Y output from the first converter unit 230 at a given temperature through the DSP 250 based on the second digital data Yref output from the second converter unit 240. The digital data Y0 at the zero temperature characteristic is picked up and is stored (written) in the ROM 260 in the step of adjusting or checking the A/D converter circuit 220 before the shipment. In FIG. 14, the symbol "X" represents a given input voltage. Further, Y and Yref hold relationships Y=Y×t and Yref=Yref×t for the sampling period t [μs] like the above Y0.

Figure 15:
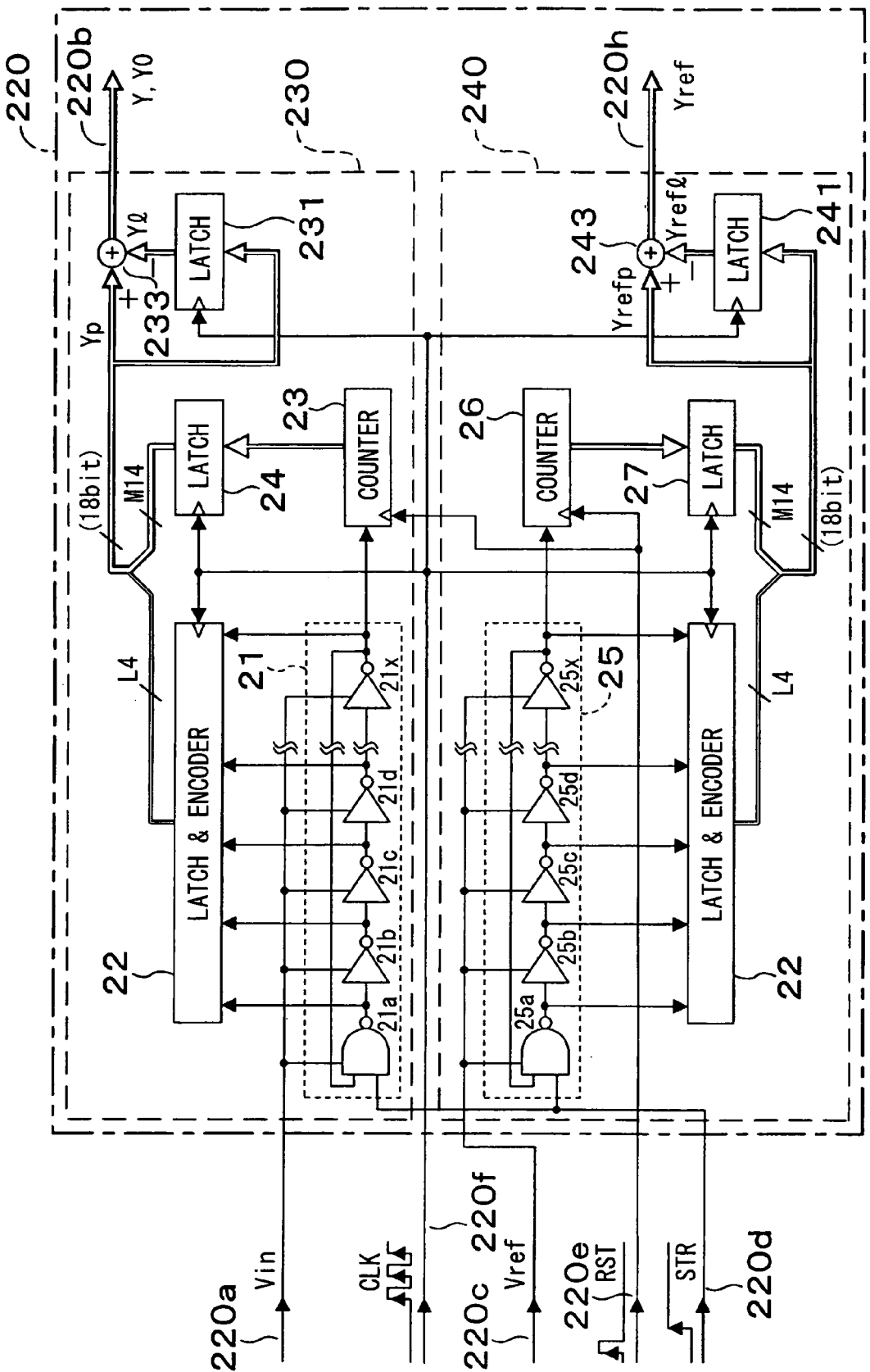
FIG. 15 is a circuit diagram illustrating a first converter unit and a second converter unit forming the A/D converter circuit according to the third embodiment of the invention.

Referring to FIG. 15, the A/D converter circuit 220 is formed by the first converter unit 230, second converter unit 240, DSP 250 and ROM 260 shown in FIG. 12. The first converter unit 230 includes the first ring delay line 21, latch and encoder 22, first counter 23 and first latch 24 described in the first embodiment, as well as the latch 231 and digital arithmetic circuit 233, and receives an analog voltage signal (input voltage Vin) as the power supply voltage for the first ring delay line 21.

The latch 231 has a function for latching the first present 18-bit data formed by the least significant 4-bit data L4 output from the latch and encoder 22 and the most significant 14-bit data output from the first latch 24 at a time point of the rising edge (or falling edge) of the latch signal, and outputting it as the first data of the last time to the digital arithmetic circuit 233 at a time point of the rising edge (or falling edge) of the next latch signal, and receives a sampling clock CLK as a latch signal from an external unit. The latch 231 operates as a first latch.

The digital arithmetic circuit 233 has a function for digitally subtracting the first data of the last time Y1 input being delayed by one sampling clock CLK after having been latched by the latch 231 from the first present data that is directly input from the latch and encoder 22 and the first latch 24, and for outputting the subtracted result as an 18-bit first digital data to the output line 220b. The digital arithmetic circuit 233 operates as first calculation means. Therefore, the first digital data Y output from the digital arithmetic circuit 233 is output as a difference between the first present data and the first data of the last time.

On the other hand, the second converter unit 240 is provided for canceling the temperature characteristics of the first converter unit 230, and includes the second ring delay line 25, latch and encoder 22, second counter 26 and second latch 27 described in the first embodiment, as well as the latch 241 and digital arithmetic circuit 243, and receives a reference voltage Vref as the power supply voltage for the second ring delay line 25. The reference voltage Vref is fed from a constant-voltage source without temperature characteristics almost free of variation in the output voltage irrespective of a change in the ambient temperature like the band-gap constant-voltage source. Further, the second ring delay line 25 is formed adjoining the first ring delay line 21 on the same semiconductor substrate so as to be thermally coupled thereto (see FIG. 5).

The latch 241 has a function for latching the second present 18-bit data formed by the least significant 4-bit data output from the latch and encoder 22 and the most significant 14-bit data output from the first latch 24 at a time point of the rising edge (or falling edge) of the latch signal, and outputting it as the second data of the last time to the digital arithmetic circuit 243 at a time point of the rising edge (or falling edge) of the next latch signal, and receives a sampling clock CLK as a latch signal from an external unit. The latch 241 operates as a second latch.

The digital arithmetic circuit 243 has a function for digitally subtracting the second data of the last time input being delayed by one sampling clock CLK after having been latched by the latch 241 from the second present data that is directly input from the latch and encoder 22 and the second latch 27, and for outputting the subtracted result as an 18-bit second digital data to the reference data line 220h. The digital arithmetic circuit 243 operates as second calculation means. Therefore, the second digital data Yref output from the digital arithmetic circuit 243 is output as a difference between the second present data and the second data of the last time.

By forming the first converter unit 230 and the second converter unit 240 as described above, the analog input voltage Vin input to the input line 220a is converted into a binary first digital data Y and is output from the output line 220b to the DSP 250. Further, the reference voltage Vref input to the reference voltage line 220c is converted into a binary second digital data Yref and is output from the reference data line 220h to the DSP 250 (FIG. 12).

The DSP 250 has a function for operating the above operation based on the first digital data Y output from the first converter unit 230, the second digital data Yref output from the second converter unit 240 and the digital data Y0 of zero temperature characteristics read from the ROM 260, and for outputting the operated result as an 18-bit digital data to the TAD output line 250a, and operates as third calculation means.

The DSP 250 executes the predetermined operation by using a hardware that executes a processing program read from the ROM 260 and an algorithm that has been set in advance. The signal control/operation processing by the DSP 250 will be described with reference to FIG. 16.

When a power source voltage is supplied to the A/D converter circuit 220, a digital data Y0 of zero temperature characteristics is, first, read out from the ROM 260 at step S101. Therefore, the preset digital data Y0 is read out from the ROM 260.

Next, at step S103, a reset signal RST is output to the first converter unit 230 and to the second converter unit 240 through the reset signal line 220e. Therefore, the first counter 23 of the first converter unit 230 and the second counter 26 of the second converter unit 240 are reset, respectively.

Next, at step S105, a start signal STR is output to the first converter unit 230 and to the second converter unit 240 via the start signal line 220d, and a sampling clock CLK is output thereto via the sampling clock line 220f. The period of the sampling clock CLK operates as a sampling period t.

Therefore, a pulse signal starts circulating in the inverting circuits 21a, etc. of the first ring delay line 21 in the first converter unit 230 and in the inverting circuits 25a, etc. of the second ring delay line 25 in the second converter unit 240 and, therefore, a digital data corresponding to the input voltage Vin (analog voltage signal) and a digital data corresponding to the reference voltage Vref are latched in synchronism with the sampling clock CLK. Accordingly, the first converter unit 230 outputs a difference between the first present data Yp and the first data of the last time as a first digital data Y1 to the output line 220b, and the second converter unit 240 outputs a difference between the second present data Yrefp and the second data of the last time as a second digital data Yrefl to the reference data line 220h.

Therefore, after the first digital data Y is taken out from the output line 220b at subsequent step S107, the second digital data Yref is taken out from the reference data line 220h at step S109, to execute a predetermined digital calculation operation of a ratio which is defined as (Y−Y0)/(Yref−Y0) at step S111, and a digital data DT which is the calculation result is output at step S113 to the TAD output line 250a. Thus, the first digital data Y output from the first converter unit 230 is corrected for the temperature characteristics based on the second digital data Yref output from the second converter unit 240, and is output as a digital data DT from the TAD output line 250a making it possible to obtain an A/D-converted value free of temperature characteristics.

Figure 16:
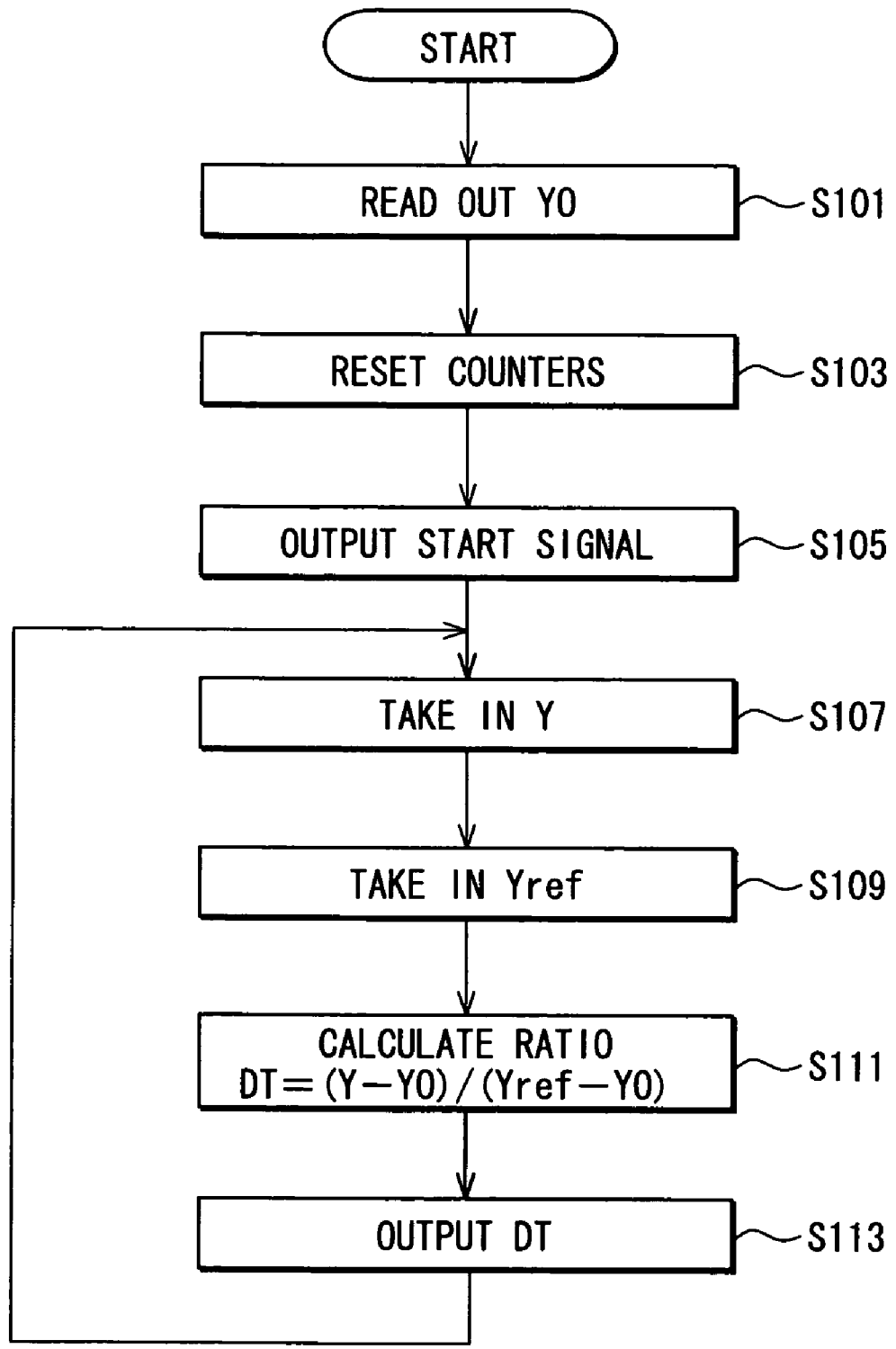
FIG. 16 is a flowchart illustrating signal control/arithmetic processing executed by a DSP shown in FIG. 12.

After the digital data DT is output as the operated result from the TAD output line 250a at step S113 as shown in FIG. 16, the routine returns to step S107 again to take out a new first digital data Y to make it possible to effect the A/D conversion at a next sampling time point.

The A/D converter circuit 220 according to the third embodiment is formed as described above, and the input voltage Vin to be A/D-converted is used as the power supply voltage for the NAND circuit 21a and INV circuits 21b, 21c, 21d to 21x in the first ring delay line 21. Namely, the position of the pulse signal circulating in the first ring delay line 21 and the number of times of circulation differ depending upon the magnitude of the input voltage Vin. Therefore, the number of times of circulation of the pulse signal is counted, and the first data of the last time counted and latched one period before a predetermined period is subtracted from the first present data which is the counted value to find a first digital data Y. Further, the second ring delay line 25 is formed by the NAND circuit 25a and INV circuits 25b, 25c, 25d to 25x which use the predetermined reference voltage Vref as the power supply voltage and of which the inverting operation time for outputting the input signal in an inverted manner varies depending upon the power supply voltage, being connected in the same number and in the same manner as the NAND circuit 21a and INV circuits 21b, 21c, 21d to 21x forming the first ring delay line 21, the NAND circuit 25a which is one of the plurality of inverting circuits starting the operation simultaneously with the start of operation of the start-up inverting circuit of the first ring delay line 21, and the INV circuits 21b, 21c, 21d to 21x and the NAND circuit 21a being formed to be thermally coupled to the first ring delay line 21. Therefore, the second digital data Yref reflects the temperature characteristics of the second ring delay line 25, the second digital data Yref being found by counting the number of times of circulation of the pulse signal and by subtracting the second data of the last time counted and latched one period before the predetermined period from the second present data that is the counted value.

Therefore, if the first digital data having a predetermined value output from the digital arithmetic circuit 233 without being affected by a change in the ambient temperature of the first ring delay line 21 in response to a predetermined input voltage Vin (=x 0) is denoted by Y0, the first digital data output from the digital arithmetic circuit 233 in response to a given input voltage Vin is denoted by Y and the second digital data output from the digital arithmetic circuit 243 is denoted by Yref, the DSP 250 produces a result through the operation expressed as $(Y-Y0)/(Yref-Y0)$ canceling the temperature characteristics of the first ring delay line 21 by the temperature characteristics of the second ring delay line 25. Therefore, the calculated result is little affected by the temperature characteristics of the first ring delay line 21 and of the second ring delay line 25. The operated result is output as a binary digital data DT to the TAD output line 250a to thereby obtain the A/D-converted value suppressing variation in the digital data DT caused by a change in the ambient temperature without requiring any complex operation.

Fourth Embodiment

Figure 17:
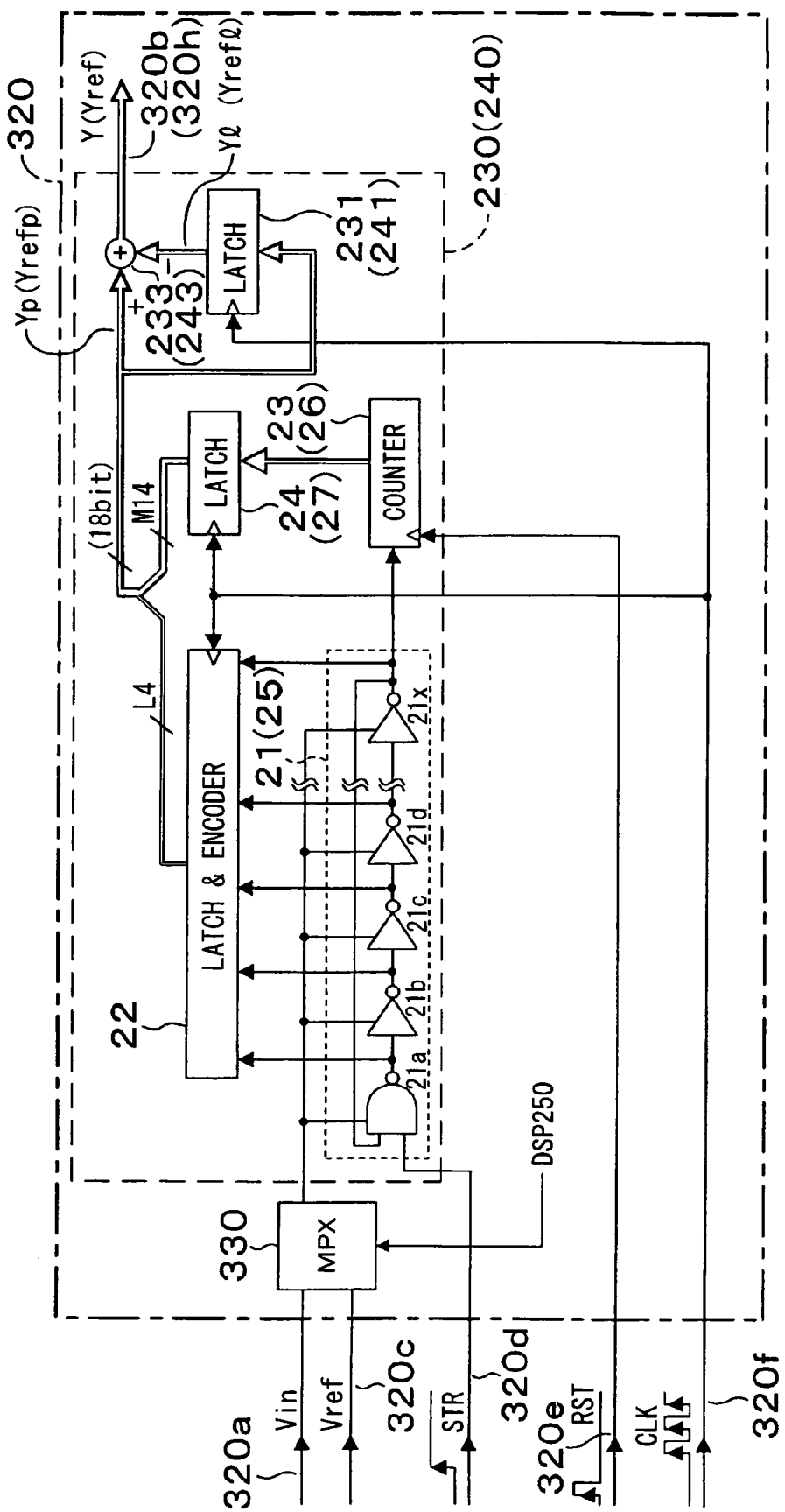
FIG. 17 is a circuit diagram illustrating a converter unit forming the A/D converter circuit according to the fourth embodiment of the invention.

An A/D converter circuit 320 according to a fourth embodiment is shown in FIG. 17. The A/D converter circuit 320 according to the fourth embodiment is different from the A/D converter circuit 220 of the third embodiment with respect to that the second converter unit 240 is omitted. Therefore, the constituent portions substantially the same as those of the A/D converter circuit 220 of the third embodiment and as those of the A/D converter circuit 20 of the first embodiment are denoted by the same reference numerals and their description is not repeated.

Referring to FIG. 17, the A/D converter circuit 320 is formed by a first converter unit 230, a multiplexer 330, and the DSP 250 and the ROM 260 shown in FIG. 12, but is not provided with the second converter unit 240 unlike that of the A/D converter circuit 220 of the third embodiment. That is, a multiplexer 330 is provided to select and output either the input voltage Vin input from the input line 320a or the predetermined reference voltage Vref in response to the input of a switching signal (selective control signal). As will be described later, the DSP 250 switches the input of the multiplexer 330 so that the first converter unit 230 also operates as the second converter unit 240.

Therefore, the A/D converter circuit 320 is not provided with the second converter unit 240 but is virtually provided with the second converter unit 240 as shown in FIG. 12 to output the second digital data Yref from the reference data line 320h to the DSP 250.

Specifically, as shown in FIG. 17, the input line 320a and the reference voltage line 320c are connected to the multiplexer 330, and its output is fed as a power supply voltage for the first ring delay line 21 in the first converter unit 230. The multiplexer 330 receives a switching signal output from the DSP 250. Responsive to the switching signal output from the DSP 250, therefore, the input connected to the output is switched to the input voltage Vin or to the reference voltage Vref.

By forming the multiplexer 330 as described above, the DSP 250 executes the signal control/operation processing as described below according to a processing program read out from the ROM 260. Here, the signal control/operation processing is the one modified for the fourth embodiment from the control processing of the third embodiment described with reference to FIG. 16. Therefore, the processing portions substantially the same as those of the processing of FIG. 16 are denoted by the same reference numerals to simplify the description.

Figure 18:
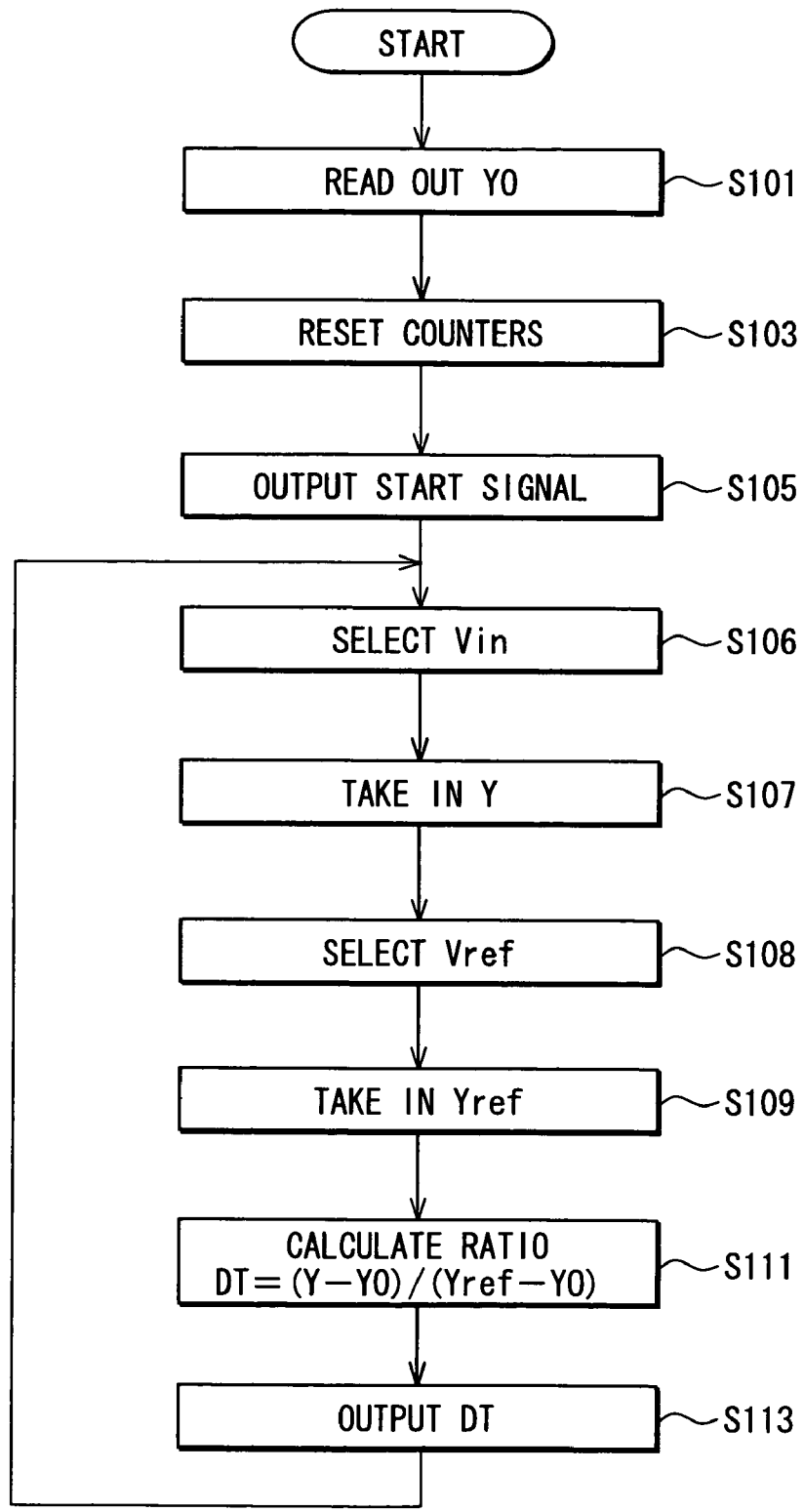
FIG. 18 is a flowchart illustrating signal control/arithmetic processing executed by the DSP shown in FIG. 12.

Referring to FIG. 18, if the power source voltage is supplied to the A/D converter circuit 220, a digital data Y0 of zero temperature characteristic is, first, read out at step S101 from the ROM 260. Therefore, the digital data Y0 that is set already is read out from the ROM 260.

Next, at step S103, a reset signal RST is output to the first converter unit 230 (second converter unit 240) via the reset signal line 220e. This resets the first counter 23 in the first converter unit 230 (second counter 26 in the second converter unit 240).

Next, at step S105, a start signal STR is output to the first converter unit 230 via the start signal line 220d, and a sampling clock CLK is output thereto via the sampling clock line 220f. Therefore, a pulse signal starts circulating in the inverting circuits 21a, etc. in the first ring delay line 21 of the first converter unit 230, and a digital data corresponding to the input voltage Vin (analog voltage signal) and a digital data corresponding to the reference voltage Vref are latched in synchronism with the sampling clock CLK.

Next, at step S106, the input to the multiplexer 330 is selected. Here, a switching signal (analog input selection signal) for selecting the input line 320a is output to the multiplexer 330 in order to receive the input voltage Vin from the input line 320a and to output it to the first ring delay line 21. Therefore, the input voltage Vin is selected and input to the multiplexer 330 via the input line 320a, and the first ring delay line 21 receives the input voltage Vin as the power supply voltage.

The first converter unit 230 outputs a difference between the first present data Yp and the first data of the last time Yl as a first digital data Y to the output line 320b. At subsequent step S107, therefore, the first digital data Y is taken in from the output line 220b.

After the first digital data Y is taken in at step S107, a switching signal (reference voltage input selection signal) for selecting the reference voltage line 320c is output at step S108 to the multiplexer 330 to input the reference voltage Vref from the reference voltage line 320c and to output it to the first ring delay line 21 that operates as the second ring delay line 25. Therefore, the reference voltage Vref is selected and input to the multiplexer 330 via the reference voltage line 320c, and the first ring delay line 21 operating as the second ring delay line 25 receives the reference voltage Vref as the power supply voltage.

Therefore, the first converter unit 230 that operates as the second converter unit 240 outputs the difference between the second present data and the second data of the last time as a second digital data Yref to the output line 320b which is the reference data line 320h. At subsequent step S109, therefore, a second digital data Yref is taken in from the output line 320b.

Thus, the first digital data Y and the second digital data Yref are provided. At subsequent step S111, therefore, a predetermined digital calculation operation $(Y-Y0)/(Yref-Y0)$ is executed, and a digital data DT which is the calculation result is output from the TAD output line 250a at step S113. Referring to FIG. 18, after the digital data DT is output as the calculation result from the TAD output line 250a at step S113, the routine returns to step S106, where the input of the multiplexer 330 is switched to the input line 320a and a new first digital data Y is received to enable the A/D conversion at a next sampling time point.

The A/D converter circuit 320 according to the fourth embodiment is formed as described above, and the input voltage Vin to be A/D-converted is used as the power supply voltage for the NAND circuit 21a and INV circuits 21b, 21c, 21d to 21x in the first ring delay line 21. Namely, the position of the pulse signal circulating in the first ring delay line 21 and the number of times of circulation differ depending upon the magnitude of the input voltage Vin. Therefore, the number of times of circulation of the pulse signal is counted, and the first data of the last time counted and latched one period before a predetermined period is subtracted from the first present data which is the counted value to find a first digital data Y. Further, a predetermined reference voltage Vref is input as the power supply voltage for the NAND circuit 21a and INV circuits 21b, 21c, 21d to 21x in the first ring delay line 21, the number of times of circulation of the pulse signal is counted, and the second data of the last time counted and latched one period before a predetermined period is subtracted from the second present data which is the counted value to find a second digital data Yref which reflects the temperature characteristics of the first ring delay line 21.

That is, the A/D converter circuit 220 of the third embodiment is equipped with the first ring delay line 21 and the first counter 23 corresponding to the input voltage Vin input to the input line 220a, as well as the second ring delay line 25 and the second counter 26 corresponding to the predetermined reference voltage Vref, separately. In the A/D converter circuit 320 of the fourth embodiment, however, the input voltage Vin and the predetermined reference voltage Vref are both input to the first ring delay line 21 and to the first counter 23 to find the first digital data Y and the second digital data Yref. Therefore, the first digital data Y and the second digital data Yref are A/D-converted through the same first ring delay line 21 and the first counter 23 suppressing a decrease in the effect of operation expressed as (Y−Y0)/(Yref−Y0) executed by the DSP 250 that arises from the dispersion in the delay characteristics of the two ring delay lines of when the first and second ring delay lines are provided for the input voltage Vin and for the predetermined reference voltage Vref, respectively. Besides the circuit scale can be decreased. Accordingly, an A/D-converted value is obtained further suppressing variation in the digital data caused by a change in the ambient temperature without requiring any complex operation.

Fifth Embodiment

Figure 19:
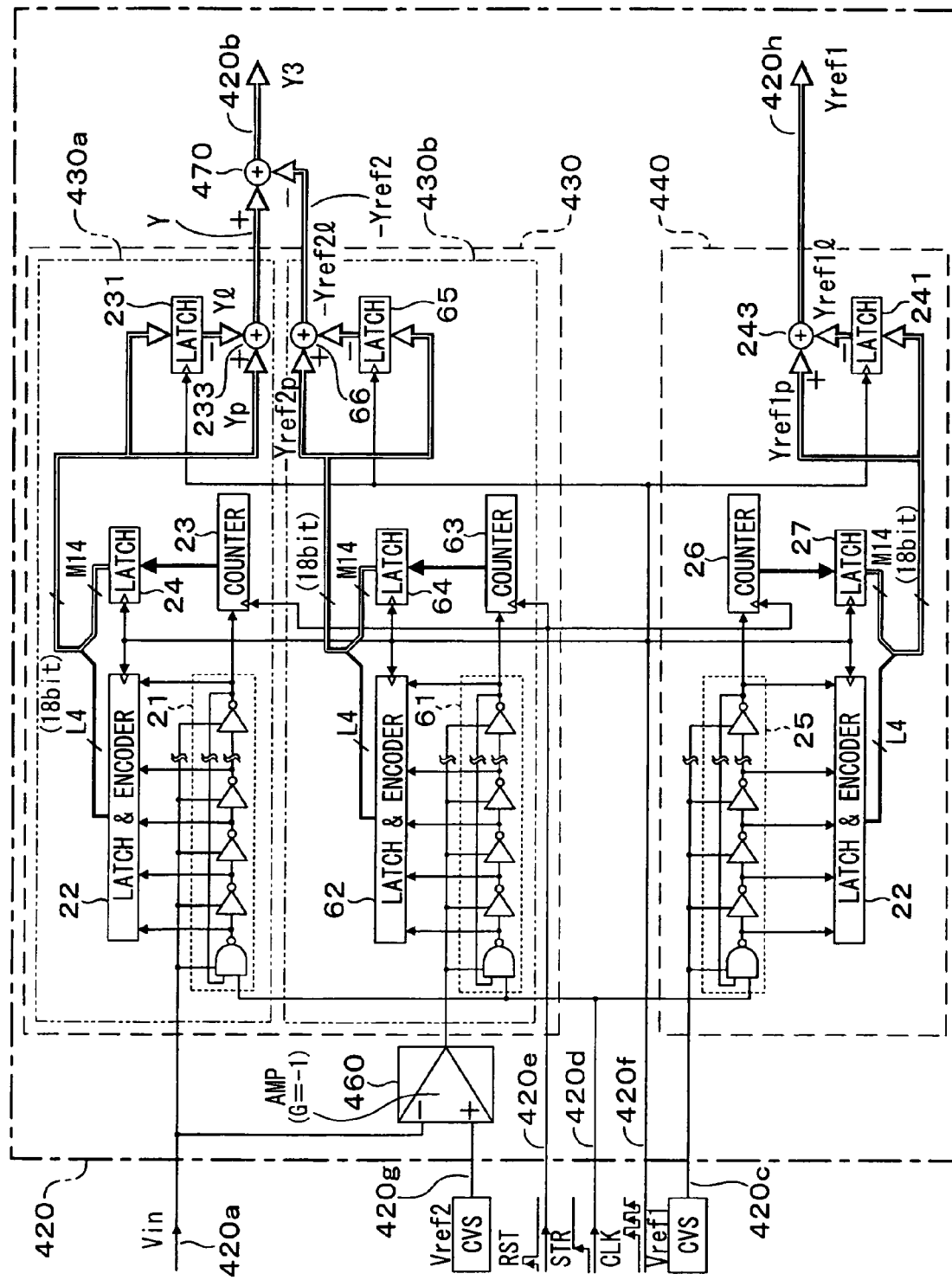
FIG. 19 is a circuit diagram illustrating a first converter unit and a second converter unit forming the A/D converter circuit according to the fifth embodiment of the invention.

An A/D converter circuit 420 according to a fifth embodiment is shown in FIG. 19. In the A/D converter circuit 220 according to the third embodiment and in the A/D converter circuit 320 according to the fourth embodiment, the first converter unit 230 is formed by the single first ring delay line. In the A/D converter circuit 420 according to the fifth embodiment, however, a first converter unit 430 is functionally divided into two converter section 430a and a converter section 430b, a first digital data is output from the converter section 430a as an A/D-converted value for the input voltage Vin and a second digital data is output from the converter section 430b as an A/D-converted value inverting the polarity relative to the input voltage Vin with the reference voltage Vref2 as a center.

Here, attention should be given to that in the fifth embodiment, the digital data Yref output from the reference data line in the third and fourth embodiments is referred to as a fourth digital data Yref. Further, the constituent portions substantially the same as those of the A/D converter circuits 20, 120 and 320 of the above embodiments are denoted by the same reference numerals and their description is not repeated.

The A/D converter circuit 420 is formed by a first converter unit 430, a second converter unit 440, an inverting circuit 460, a digital arithmetic circuit 470, and the DSP 250 and the ROM 260 shown in FIG. 12. The first converter unit 430 is formed by the converter section 430a and the converter section 430b. The converter section 430a is formed in the same manner as the first converter unit 230 in the A/D converter circuit 220 of the third embodiment. Therefore, the input voltage Vin input to the input line 420a is converted into a first digital data and is output.

Figure 20:
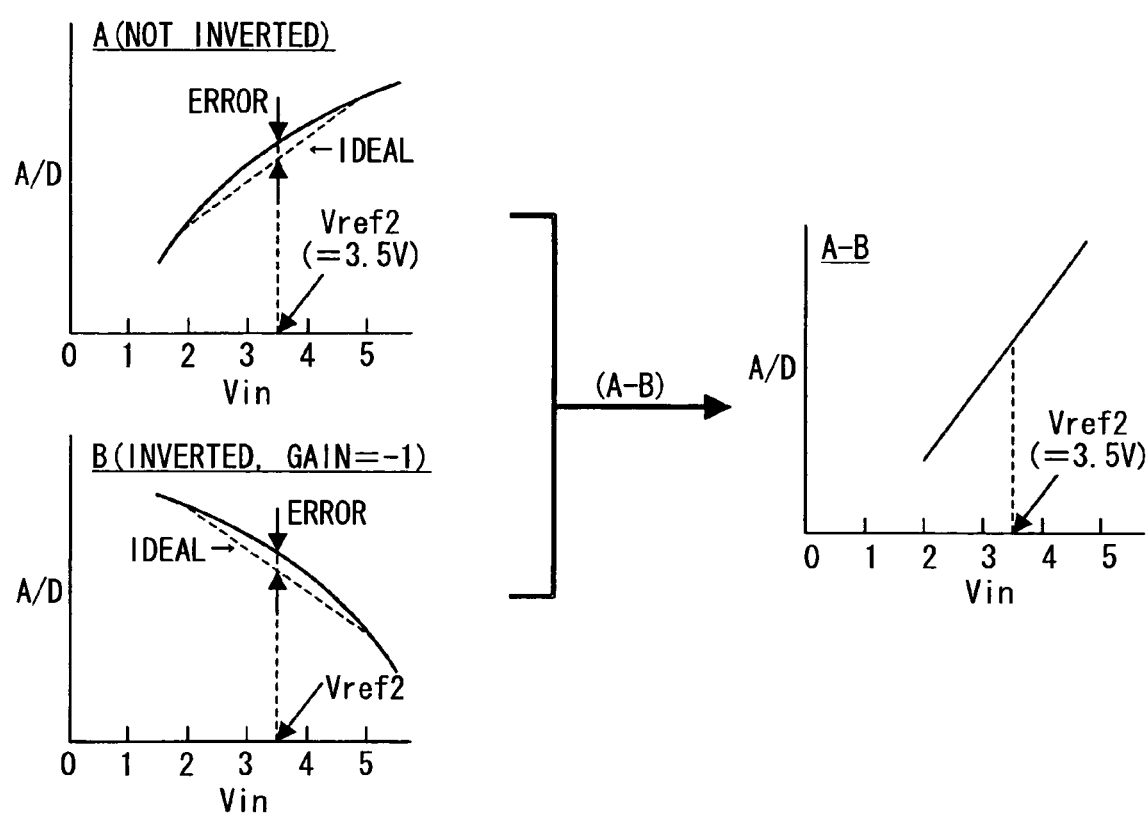
FIG. 20 is a set of graphs illustrating operation principle of the A/D converter circuit according to the fifth embodiment.

As shown in FIG. 20 (characteristic graph on the left upper side) representing characteristics of the case A of when not inverted, however, despite the input voltage Vin is linearly changing (ideal), the A/D-converted value (first digital data) is output nonlinear convex curve. This is because the inverting operation time (delay time) due to the NAND circuit 21a and INV circuits 21b, 21c, 21d to 21x forming the first ring delay line 21 is not linearly varying relative to the change in the power supply voltage.

Therefore, the A/D converter circuit 420 according to the fifth embodiment is equipped with the converter section 430b formed in the same manner as the converter section 430a. That is, as shown in FIG. 19, a ring delay line 61 of the converter section 430b is formed in the same manner as the first ring delay line 21 of the converter section 430a. NAND circuit 61a and INV circuits 61b, 61c, 61d to 61x of the ring delay line 61 correspond to the NAND circuit 21a and INV circuits 21b, 21c, 21d to 21x of the first ring delay line 21. Further, a latch and encoder 62, counter 63, latch 64, latch 65 and digital arithmetic circuit 66 in the converter section 430b are so formed as to correspond to the latch and encoder 22, first counter 23, first latch 24, latch 231 and digital arithmetic circuit 233 in the converter section 430a.

Further, an inverting amplifier 460 is provided for inverting the input voltage Vin in the increasing/decreasing direction with a reference voltage Vref2 (central intermediate voltage) as a reference which is nearly at the center in a range of voltage where the value of the first digital data output from the digital arithmetic circuit 233 of the converter section 430a varies nearly constantly relative to a change in the power supply voltage. An inverted input voltage −Vin output from the inverting amplifier 460 is input to the converter section 430b, i.e., input as a power supply voltage to the ring delay line 61. Here, a symbol "−" means that an increase or decrease of the analog voltage value is inverted relative to the certain reference voltage.

In the fifth embodiment shown in FIG. 20, for example, the reference voltage Vref2 is set to be 3.5 V. As shown in FIG. 20, on the left lower side, representing characteristics of the case B of when inverted, the digital arithmetic circuit 66 in the converter section 430b outputs a second digital data (−Yref2=inverted data of the last time (−Yref21)−present inverted data (−Yref2p)) as an A/D-converted value of which the polarity is inverted relative to the input voltage Vin with the reference voltage Vref2 as a center. Therefore, the first digital data is digitally subtracted from the second digital data by the digital arithmetic circuit 470.

That is, the characteristics of the case B of when inverted are subtracted from the characteristics of the case A of when not inverted (A−B) making it possible to cancel the nonlinear characteristics of the first digital data by the second digital data. As shown in FIG. 20, the right side, it is made possible to improve the linearity of the binary third digital data Y3 output as a result of subtraction (A−B) from the digital arithmetic circuit 470 through the output line 420b.

The converter section 430b operates as a second pulse circulating circuit, the counter 63 operates as a second counter, the latch 65 operates as a second latch, and the digital arithmetic circuit 66 operates as second arithmetic means, respectively. Further, the inverting amplifier 460 operates as inverting means, and the digital arithmetic circuit 470 operates as third arithmetic means, respectively.

The inverting amplifier 460 is formed by, for example, an operational amplifier, i.e., by an auto-zero amplifier or a switched capacitor circuit having a function for correcting the offset voltage to become zero as much as possible. Auto-zero amplifiers are well known as disclosed in, for example, Japanese Patent No. 1874828 and Japanese Patent No. 3536121. The switched capacitor circuits are disclosed in, for example, JP 5-243857A, JP 6-343013A, JP 2004-179875A and JP 2004-222018A. Errors in the A/D conversion arising from the offset voltage of the operational amplifier can therefore be suppressed.

The reference voltage Vref2 is fed, through a reference voltage line 420g, from a constant-voltage source (CVS), such as a constant-voltage circuit of the band-gap type which uses, for example, a band-gap voltage as the reference voltage. Therefore, the reference voltage Vref2 almost free of temperature variation is produced as an output voltage despite the ambient temperature of the A/D converter circuit 420 undergoes the change.

Figure 21:
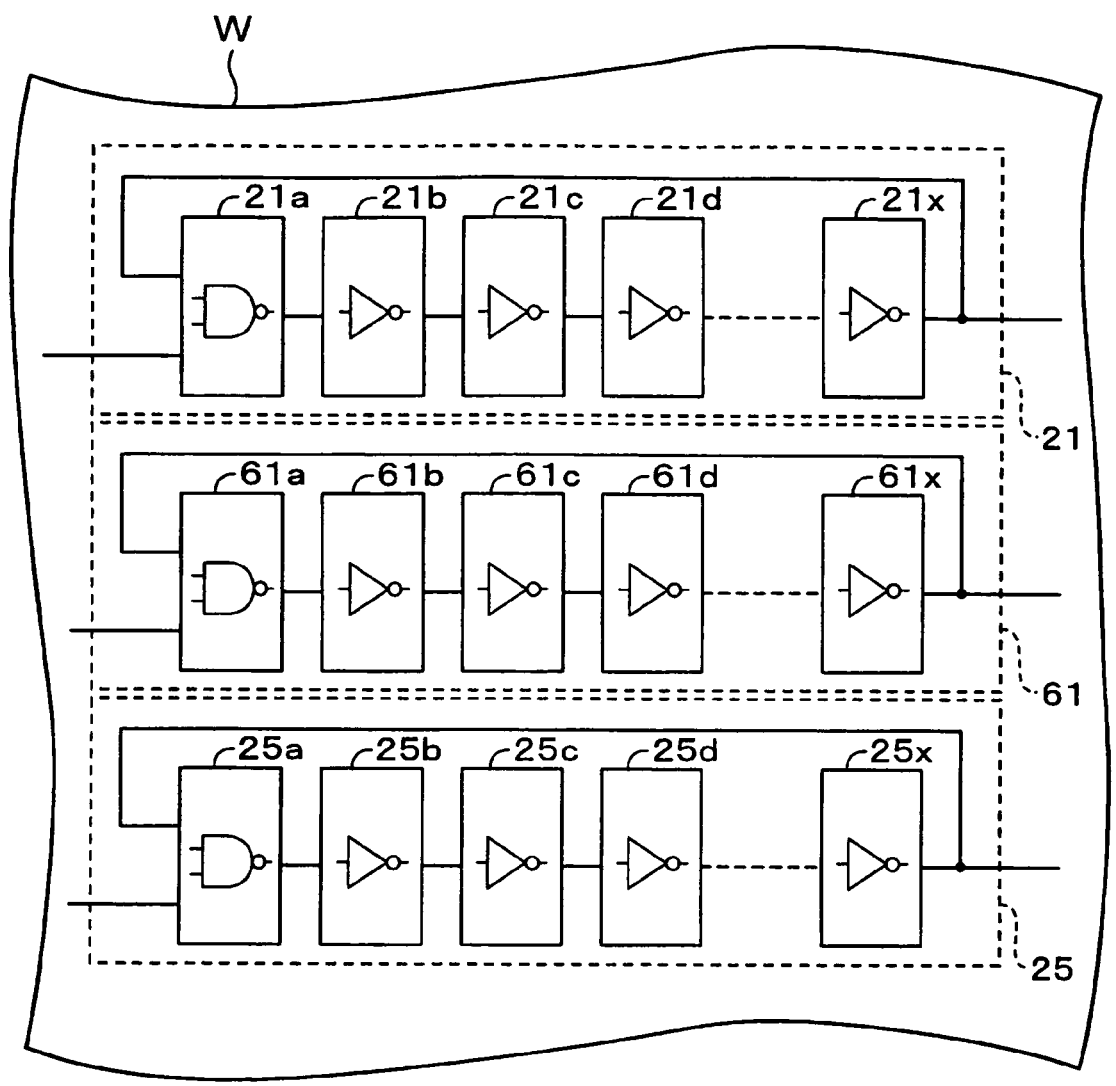
FIG. 21 is a diagram illustrating a first ring delay line, an additional ring delay line and a second ring delay line on a semiconductor substrate shown in FIG. 19.

While the first converter unit 430 is formed as described above, the second converter unit 440 is formed nearly in the same manner as the second converter unit 240 in the A/D converter circuit 220 of the third embodiment, and the reference voltage Vref1 input from the reference voltage line 420c is converted into the fourth digital data Yref1 and is output to the reference data line 420h. As shown in FIG. 21, the second ring delay line 25 forming the second converter unit 440 is formed adjacent the first ring delay line 21 and the ring delay line 61 of the first converter unit 430 on the same semiconductor substrate W so as to be thermally coupled thereto.

The reference voltage Vref1 operates as a reference voltage Vref of the A/D converter circuit 220 of the third embodiment, i.e., operates as a predetermined reference voltage. Further, the second counter 26 operates as a third counter, and the digital arithmetic circuit 243 operates as fourth arithmetic means.

By forming the A/D converter circuit 420 of this embodiment as described above, the input voltage Vin to be A/D-converted is used as the power supply voltage for the NAND circuit 21a and INV circuits 21b, 21c, 21d to 21x in the first ring delay line 21 of the converter section 430a. Namely, the position of the pulse signal circulating in the first ring delay line 21 and the number of times of circulation differ depending upon the magnitude of the input voltage Vin. Therefore, the number of times of circulation of the pulse signal is counted by the first counter 23, and the data of the last time Y1 counted and latched by the latch 231 one period before a predetermined period is subtracted from the present data Yp which is the counted value by the digital arithmetic circuit 233 to find a first digital data Y.

The input voltage Vin is inverted through the inverting amplifier 460 in the increasing/decreasing direction with the reference voltage Vref2 as a reference which is nearly at the center in a range of the power supply voltage where the value of the first digital data varies nearly constantly relative to a change in the power supply voltage. The inverted input voltage −Vin is used as a power supply voltage to the NAND circuit 61a and INV circuits 61b, 61c, 61d to 61x formed in the ring delay line 61. The position of the pulse signal circulating in the ring delay line 61 and the number of times of circulation differ depending upon the magnitude of the inverted input voltage −Vin. Therefore, the number of times of circulation of the pulse signal is counted by the counter 63, and the inverted data of the last time −Yref2l counted and latched by the latch 65 one period before a predetermined period is subtracted from the present inverted data −Yref2p which is the counted value by the digital arithmetic circuit 66 to find a second digital data −Yref2. The ring delay line 61 is formed in the same manner as the first ring delay line 21.

Therefore, the second digital data −Yref2 has output characteristics inverted in the increasing/decreasing direction of the input voltage Vin relative to the first digital data Y with the reference voltage Vref2 as a reference. By outputting a result of subtraction obtained by subtracting the second digital data −Yref2 from the first digital data Y by the digital arithmetic circuit 233 as a binary third digital data Y3 to the output line 420b, therefore, the nonlinearity of the first ring delay line 21 can be canceled by the nonlinearity of the ring delay line 61.

The second ring delay line 25 in the second converter unit 440 is formed by the NAND circuit 25a and INV circuits 25b, 25c, 25d to 25x that use the predetermined reference voltage Vref1 as a power supply voltage and of which the inverting operation time for outputting the input signal in an inverted manner varies depending upon the power supply voltage, that are connected in the same number and in the same manner as the NAND circuit 21a and INV circuits 21b, 21c, 21d to 21x forming the first ring delay line 21, the NAND circuit 25a which is one of the plurality of inverting circuits starting the operation simultaneously with the start of operation of the start-up inverting circuit in the first ring delay line 21, and the INV circuits 21b, 21c, 21d to 21x and the NAND circuit 21a being so formed as to be thermally coupled to the first ring delay line 21. Therefore, the fourth digital data Yref1 obtained by counting the number of circulation of the pulse signal and by subtracting the second data of the last time Yref1l counted and latched one period before the predetermined period from the second present data Yref1p which is the counted value, reflects the temperature characteristics of the second ring delay line 25.

Therefore, if the third digital data Y3 output maintaining a predetermined value from the digital arithmetic circuit 470 without affected by a change in the ambient temperature of the first ring delay line 21 in response to a predetermined input voltage Vin (=x 0) is denoted by Y0, the third digital data Y3 output from the digital arithmetic circuit 470 in response to a given input voltage Vin is denoted by Y and a fourth digital data Y4 output from the digital arithmetic circuit 243 is denoted by Yref1, the DSP 250 produces a result through the calculation expressed as (Y−Y0)/(Yref1−Y0) without being affected by the temperature characteristics of the first ring delay line 21 and the ring delay line 61, making it possible to improve the precision inclusive of the linearity of the A/D-converted output. Therefore, the operated result is output as a binary digital data DT to the TAD output line 250a to thereby obtain an A/D-converted value further suppressing variation in the digital data caused by a change in the ambient temperature without requiring any complex operation.

Sixth Embodiment

Figure 22:
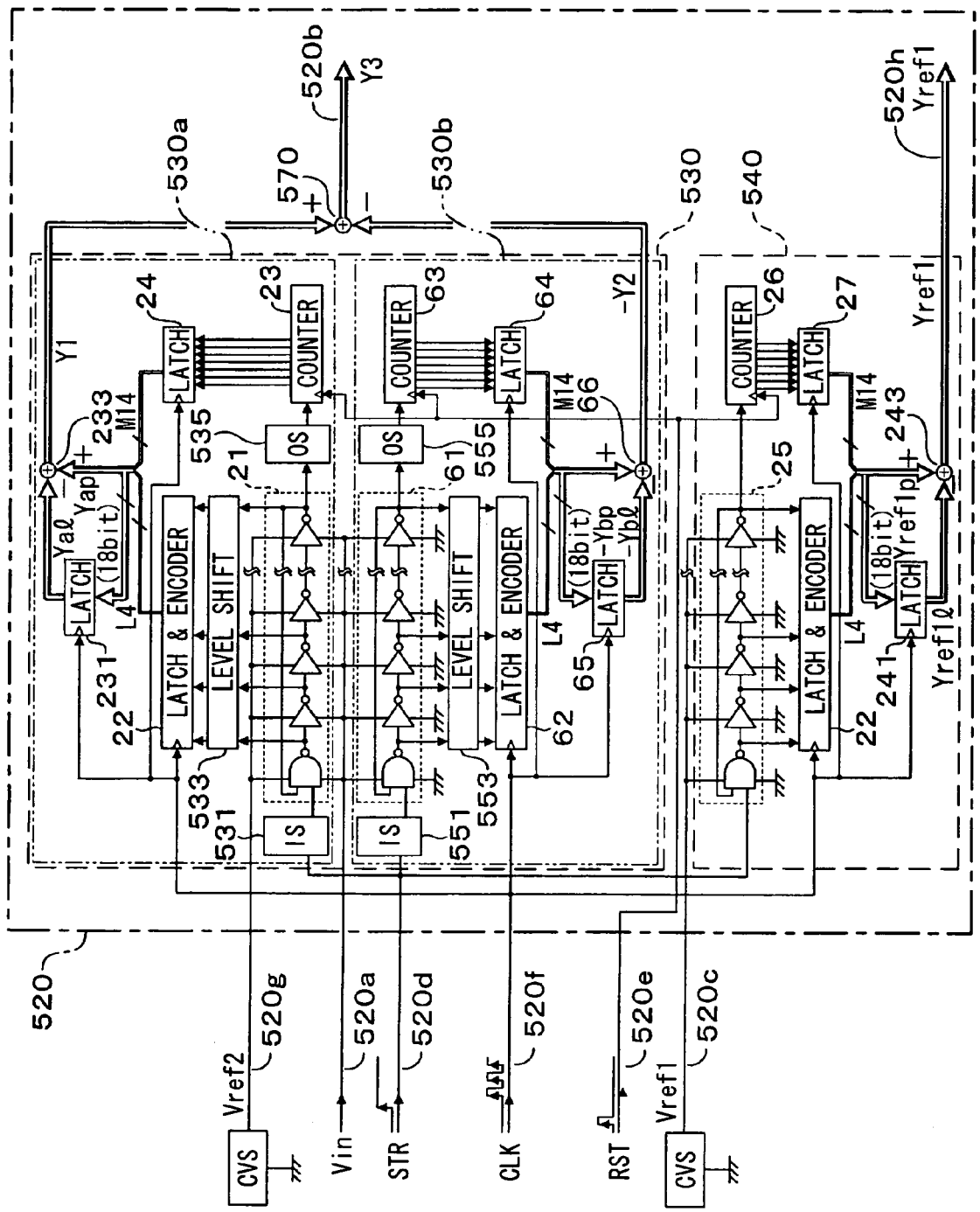
FIG. 22 is a circuit diagram illustrating a first converter unit and a second converter unit forming the A/D converter circuit according to a sixth embodiment of the invention.

An A/D converter circuit 520 according to a sixth embodiment is shown in FIG. 22. In the A/D converter circuit 420 of the above fifth embodiment, the input voltage Vin is inverted by the inverting amplifier 460 in the increasing/decreasing direction with the reference voltage Vref as a reference and is input to the ring delay line 61. Use of the inverting amplifier 460, however, results in an increase in the scale of the circuit. The sixth embodiment, therefore, attempts to improve the linearly of the A/D-converted output without using the inverting amplifier 460 and without executing complex calculation operation like the A/D converter circuit 420 of the fifth embodiment. The constituent portions substantially the same as those of the A/D converter circuits 20, 120, 320 and 420 of the above embodiments are denoted by the same reference numerals and their description is not repeated.

Referring to FIG. 22, the A/D converter circuit 520 is formed by a first converter unit 530, a second converter unit 540, a digital arithmetic circuit 570, and the DSP 250 and the ROM 260 shown in FIG. 12. The first converter unit 530 is formed by two first converter units 530a and 530b. The first converter unit 530a is different from the A/D converter circuit 420 of the fifth embodiment with respect to that the input voltage Vin input to an input line 520a is not used as the power supply voltage but is used as the reference operation voltage for the NAND circuit 21a and INV circuits 21b, 21c, 21d to 21x of the first ring delay line 21, that the ring delay line 61 does not receive the inverted input voltage −Vin but, instead, receives the analog input voltage Vin that is input to the input line 520a, and that an input level shifter 531 is provided.

That is, the input line 520a is connected to the first ring delay line 21 so that the input voltage Vin input to the input line 520a can be input to the first ring delay line 21 as the reference operation voltage of the first ring delay line 21, and the input line 520a is connected to the ring delay line 61 so that the input voltage Vin can be input to the ring delay line 61 as the operation power supply voltage of the ring delay line 61. That is, the reference operation potential of the first ring delay line 21 and the operation power-source potential of the ring delay line 61 are equalized and are connected to the input line 520a.

As described above, the first ring delay line 21 uses the reference operation voltage as the input voltage Vin and, therefore, the operation power supply voltage must be set to be higher than the above voltage. In the A/D converter circuit 520, therefore, the constant-voltage source is connected to the reference voltage line 520g so that the predetermined reference voltage Vref2 output from the constant-voltage source is fed as the operation power supply voltage for the first ring delay line 21. Like the constant-voltage source described in the fifth embodiment, the above constant-voltage source is the one such as a constant-voltage circuit of the band-gap type using a band-gap voltage as the reference voltage, and produces a reference voltage Vref2 almost free of temperature change in the output voltage despite a change in the ambient temperature of the A/D converter circuit 520. The reference voltage Vref2 is set to be twice as great as nearly the central voltage in a range where the input voltage Vin which is an analog voltage signal varies.

When the input voltage Vin varies over, for example 2V to 5 V, the reference voltage Vref2 is set to be 7 V (=3.5 V×2) which is twice as great as the central voltage of 3.5 V. As described in the fifth embodiment with reference to FIG. 20, further, the reference voltage Vref2 is set to be twice as great as nearly the central voltage in a range of voltage where a value of the first digital data output from the digital arithmetic circuit 233 varies nearly constantly relative to a change in the input voltage Vin. Therefore, the reference voltage Vref2 (e.g., 7 V) is set as an operation power supply voltage to the NAND circuit 21a and INV circuits 21b, 21c, 21d to 21x forming the first ring delay line 21, and the input voltage Vin (e.g., the central voltage of 3.5 V) is set as the reference operation voltage.

The ring delay line 61, on the other hand, uses the operation power supply voltage as the input voltage Vin and, therefore, the reference operation voltage must be set to be lower than the above voltage. In the A/D converter circuit 520, therefore, a predetermined voltage lower than a minimum input voltage Vin, e.g., ground GND of the A/D converter circuit 520 is set to be the reference operation voltage. The ground GND is set to be the same as the ground GND of the constant-voltage source. Accordingly, the input voltage Vin (e.g., the central voltage of 3.5 V) is set as an operation power supply voltage to the NAND circuit 61a and INV circuits 61b, 61c, 61d to 61x forming the ring delay line 61, and the ground potential (e.g., 0 V) is set as the reference operation voltage.

By forming the first ring delay line 21 and the ring delay line 61 as described above, the operation power supply voltage for the NAND circuit 21a and INV circuits 21b, 21c, 21d to 21x of the first ring delay line 21 is fixed to the reference voltage Vref2 (e.g., 7 V), and the reference operation voltage varies depending upon a change in the input voltage Vin. Further, the operation power supply voltage 61 V+ for the NAND circuit 61a and INV circuits 61b, 61c, 61d to 61x of the ring delay line 61 varies depending upon a change in the input voltage Vin while the reference operation voltage is fixed to the ground GND.

Figure 23:
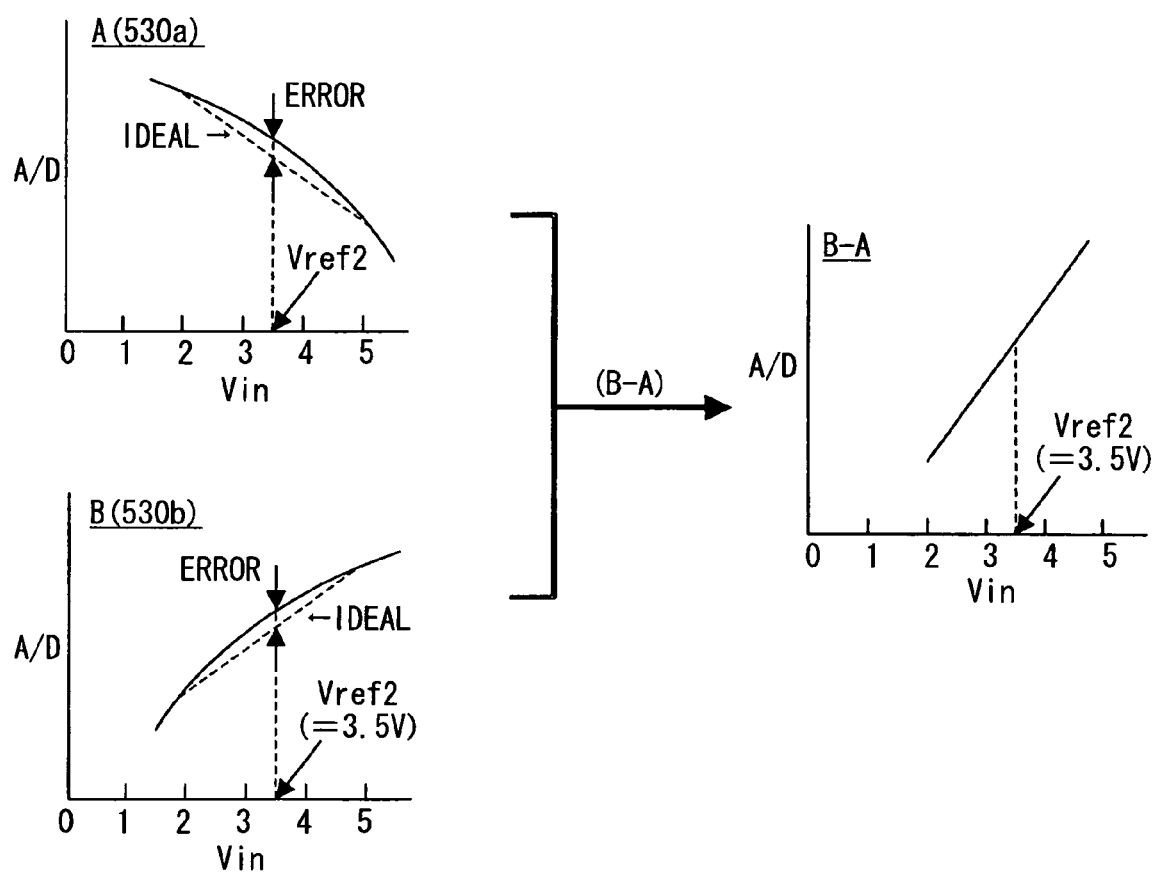
FIG. 23 is a diagram illustrating operation principle of the A/D converter circuit according to the sixth embodiment.

Therefore, an increase in the input voltage Vin results in an increase in the reference operation voltage for the NAND circuit 21a and INV circuits 21b, 21c, 21d to 21x of the first ring delay line 21 and in an increase in the operation power supply voltage for the NAND circuit 61a and INV circuits 61b, 61c, 61d to 61x of the ring delay line 61. This causes a decrease in the operation voltage fed to the NAND circuit 21a, etc. of the first ring delay line 21 and an increase in the operation voltage fed to the NAND circuit 61a, etc. of the ring delay line 61. Accordingly, the input voltage Vin input to the input line 520a is output as the first digital data Y1 and the second digital data −Y2 having characteristics as shown in FIG. 23. The first data Y1 is a difference between a present data Yap and a previous data Yal produced last time and stored in the latch 231 one period before. Similarly, the second digital data −Y2 is a difference between a present data −Ybp and a previous data −Ybl produced last time and stored in the latch 65 one period before.

That is, while the input voltage Vin is input as the operation power supply voltage to the first ring delay line 21, an inverted analog voltage signal equivalent to the analog voltage signal that is inverted in the increasing/decreasing direction with nearly the central voltage in the range where the input voltage Vin varies as a reference, is input as the operation voltage to the ring delay line 61. When the input voltage Vin varies over, for example, 2 V to 5 V therefore, the input voltage Vin which is inverted in the increasing/decreasing direction with the central voltage of 3.5 V (Vref2 of FIG. 23) as a reference is output as the second digital data Y2 from the digital arithmetic circuit 66. As described with reference to FIG. 20, therefore, the input voltage Vin can be inverted in the increasing/decreasing direction through the A/D converter circuit 520 like inverting the input voltage Vin in the increasing/decreasing direction with the reference voltage Vref2 as a reference by the inverting amplifier 460 in the A/D converter circuit 420 of the fifth embodiment.

Further, by setting the reference voltage Vref2 to be twice as great as nearly the central voltage in the range of voltage where the value of the first digital data output from the digital arithmetic circuit 233 varies nearly constantly relative to a change in the input voltage Vin, a third digital data Y3 obtained by subtracting the second digital data −Y2 from the first digital data Y1 features improved linearity as represented by "B−A" in FIG. 23, characteristic graph shown on the right side.

The first converter unit 530b operates as a second pulse circulating circuit, the counter 63 operates as a second counter, the latch 65 operates as a second latch, and the digital arithmetic circuit 66 operates as a second arithmetic means, respectively. Further, the digital arithmetic circuit 570 operates as a third arithmetic means.

While the first converter unit 530 is formed as described above, the second converter unit 540 is formed nearly in the same manner as the second converter unit 240 in the A/D converter circuit 220 of the third embodiment, and the reference voltage Vref1 input from the reference voltage line 520c is converted into the fourth digital data Yref1 and is output to the reference data line 520h. The second ring delay line 25 forming the second converter unit 540 is adjacent the first ring delay line 21 and the ring delay line 61 of the first converter unit 530 being formed on, for example, the same semiconductor substrate so as to be thermally coupled thereto (FIG. 21).

The reference voltage Vref1 operates as a reference voltage Vref of the A/D converter circuit 220 of the third embodiment, and operates as a predetermined reference voltage. Further, the second counter 26 operates as a third counter, and the digital arithmetic circuit 243 operates as a fourth arithmetic means.

According to the sixth embodiment as described above, the operation voltage of the first ring delay line 21 is shifted toward the positive (+) side and the operation voltage of the ring delay line 61 is shifted toward the negative (−) side, respectively, with the input voltage Vin input to the input line 520a as a center. Therefore, the first ring delay line 21 and the ring delay line 61 are not capable of directly processing a start signal STR of a signal level 0 V to 5 V input from an external unit outside of the A/D converter circuit 520. Besides, the signals output from the first ring delay line 21 and the ring delay line 61 do not have the signal level 0 V to 5 V, and are not capable of directly operating the first latch and encoder 22, first counter 23 and second counter 63.

Therefore, the A/D converter circuit 520 is provided with an input level shifter (IS) 531 on the input side of the first ring delay line 21, and with output level shifter (OS) 535 on the output side of the first ring delay line 21. Further, the input level shifter 551 is provided on the input side of the ring delay line 61, and the output level shifter 555 is provided on the output side of the ring delay line 61.

Figure 24:
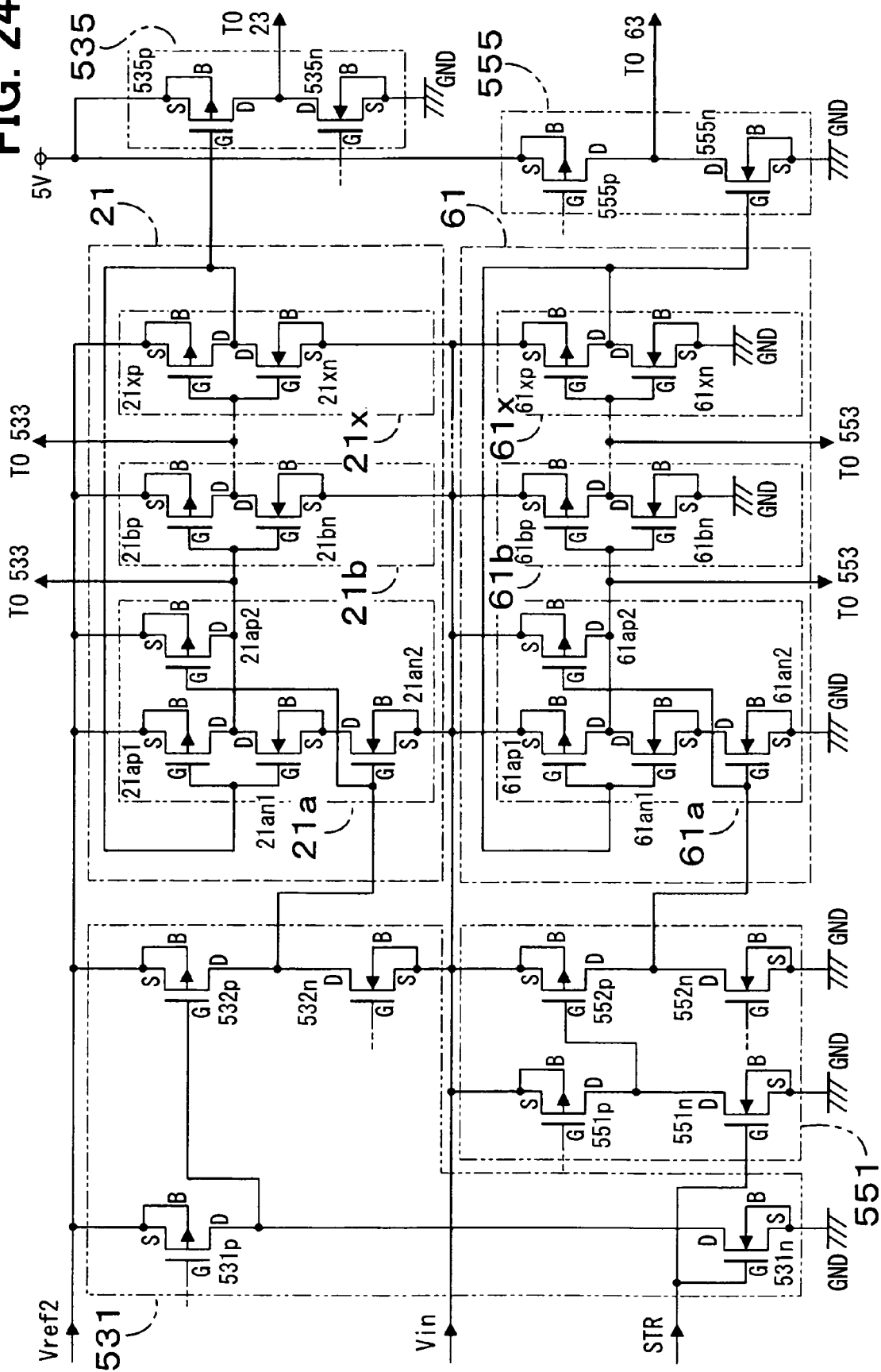
FIG. 24 is a circuit diagram illustrating the first ring delay line and the additional ring delay line shown in FIG. 22.

The input level shifter 531 shifts the signal level of the start signal STR (Lo: 0 V, Hi: 5 V) input from the start signal line 520d so as to be processed by the NAND circuit 21a of the first ring delay line 21. As shown in FIG. 24, for example, the input level shifter 531 is formed by a P-MOS transistor 531p and an N-MOS transistor 531n connected in series between the reference voltage Vref1 and the ground GND, and by a P-MOS transistor 532p and an N-MOS transistor 532n connected in series between the reference voltage Vref2 and the input voltage Vin.

Among them, the P-MOS transistor 531p and the N-MOS transistor 532n operate as a constant-current source which is an active load. The P-MOS transistor 531p feeds a constant current to the N-MOS transistor 531n which, therefore, outputs an inverted output signal from the drain D thereof as an output voltage corresponding to the start signal STR input to the gate G thereof. Further, the N-MOS transistor 532n feeds a constant current to the P-MOS transistor 532p, so that the P-MOS transistor 532p inverts an output signal of the N-MOS transistor 531n applied through the gate G thereof, and produces the inverted output from the drain D thereof. Therefore, a start signal of the Hi logic (signal level of 5 V) input from the start signal line 520d is shifted to 7 V, and a signal of the Lo logic (signal level of 0 V) is shifted to 3.5 V.

The input level shifter 551, similarly, shifts the signal level of the start signal STR (Lo: 0 V, Hi: 5 V) input from the start signal line 520d so as to be processed by the NAND circuit 61a of the ring delay line 61. As shown in FIG. 24, for example, a P-MOS transistor 551p and an N-MOS transistor 551n are connected in series, and a P-MOS transistor 552p and an N-MOS transistor 552n are connected in series between the input voltage Vin and the ground GND, respectively. The P-MOS transistor 551p and the N-MOS transistor 552n form a constant-current source which is an active load.

The P-MOS transistor 551p feeds a constant current to the N-MOS transistor 551n which, therefore, outputs an inverted output signal from the drain D thereof as an output voltage corresponding to the start signal STR input to the gate G thereof. Further, the N-MOS transistor 552n feeds a constant current to the P-MOS transistor 552p, so that the P-MOS transistor 552p inverts an output signal of the N-MOS transistor 551n applied through the gate G thereof, and produces an inverted output from the drain D thereof. Therefore, the start signal of the Hi logic (signal level of 5 V) input from the start signal line 520d is shifted to 3.5 V, and a signal of the Lo logic (signal level of 0 V) is output while being maintained at 0 V.

On the other hand, the output level shifter 535 shifts the signal level of pulse start signal (Lo: 3.5 V, Hi: 7 V) output from the first ring delay line 21 so as to be processed by the first counter 23 and the latch and encoder 22. As shown in FIG. 24, for example, the output level shifter 535 is formed by a P-MOS transistor 535p and an N-MOS transistor 535n connected in series between the power supply voltage 5 V and the ground GND, the gate G of the P-MOS transistor 535p being the input, and the drain D of the two transistors 535p and 535n being the output. The N-MOS transistor 535n operates as a constant-current source and, therefore, serves as an active load for the P-MOS transistor 535p. Therefore, a pulse signal of the Hi logic (signal level of 7 V) input from the first ring delay line 21 is shifted to 5 V, and a signal of the Lo logic (signal level of 3.5 V) is shifted to 0 V.

Similarly, further, the output level shifter 555 shifts the signal level of pulse start signal (Lo: 0 V, Hi: 3.5 V) output from the ring delay line 61 so as to be processed by the counter 63 and the latch and encoder 62. Like the output level shifter 535 shown in FIG. 24, for example, the output level shifter 555 is formed by a P-MOS transistor 555p and an N-MOS transistor 555n connected in series between the power supply voltage 5 V and the ground GND, the gate G of the N-MOS transistor 555n being the input, and the drains D of the two transistors 555p and 555n being the output. The P-MOS transistor 555p operates as a constant-current source and, therefore, serves as an active load for the N-MOS transistor 555n. Therefore, a pulse signal of the Hi logic (signal level of 3.5 V) input from the ring delay line 61 is shifted to 5 V, and a signal of the Lo logic (signal level of 0 V) is output while being maintained at 0 V.

FIG. 24 also shows the first ring delay line 21 and the ring delay line 61. The NAND circuit 21a is a general NAND circuit comprising P-MOS transistors 21ap1, 21ap2 and N-MOS transistors 21an1, 21an2, and is interposed between the reference voltage Vref1 and the input voltage Vin. The NAND circuit 61a, too, is similarly a general NAND circuit comprising P-MOS transistors 61ap1, 61ap2 and N-MOS transistors 61an1, 61an2, and is interposed between the input voltage Vin and the ground GND.

Further, the INV circuit 21b is a general inverter logic circuit comprising a P-MOS transistor 21bp and an N-MOS transistor 21bn, and is interposed between the reference voltage Vref2 and the input voltage Vin. The INV circuits 21c, 21d to 21x, too, are formed similarly to the INV circuit 21b. Like the INV circuit 21b, furthermore, the INV circuit 61b, too, is a general inverter logic circuit comprising a P-MOS transistor 61bp and an N-MOS transistor 61bn, and is interposed between the input voltage Vin and the ground GND. The INV circuits 61c, 61d to 61x, too, are formed similarly to the INV circuit 61b.

Here, as will be understood from the symbols of MOS transistors in the first ring delay line 21 and the ring delay line 61 shown in FIG. 24, when the P-MOS transistors and the N-MOS transistors are formed on a same semiconductor substrate to form the above delay lines according to the sixth embodiment, their back gates must be so formed as to be electrically isolated from the substrate potential of the semiconductor substrate.

That is, in the first ring delay line 21, the layer for forming the P-MOS transistor is so formed that the back gate B of the P-MOS transistor 21ap1 forming the NAND circuit 21a is connected to the reference voltage Vref2 being electrically isolated from the reference potential of the semiconductor substrate W, and the layer for forming the N-MOS transistor is so formed that the back gate B of the N-MOS transistor 21an1 is connected to the input voltage Vin being electrically isolated from the reference potential of the semiconductor substrate W. The back gates of the P-MOS transistor 21ap2 and of the N-MOS transistor 21an2 are similarly formed.

Figure 25A:
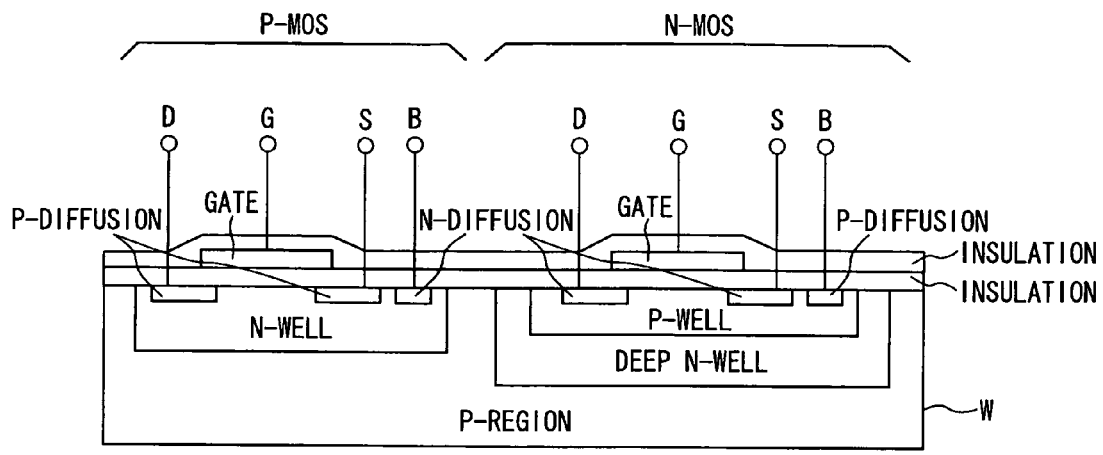
FIGS. 25A and 25B are schematic views showing MOS transistors forming the first ring delay line and the additional ring delay line shown in FIG. 24, respectively.

Specifically, as shown in FIG. 25A, when the semiconductor substrate W is of the P-type, the back gate of the N-MOS transistor assumes the substrate potential (potential of the P-region) at all times, i.e., assumes, usually, ground GND. Here, however, the N-MOS transistor is formed in a double-well configuration in which a deep N-well surrounds a P-well that surrounds the layer forming the N-MOS transistor. Therefore, the N-MOS transistor is electrically isolated, and the back gate of the N-MOS transistor is electrically isolated from the semiconductor substrate W. The layer forming the P-MOS transistor is surrounded by an N-well. When the semiconductor substrate W is of the P-type, therefore, the back gate of the N-MOS transistor can be electrically isolated from the semiconductor substrate W without employing the double well configuration.

Figure 25B:
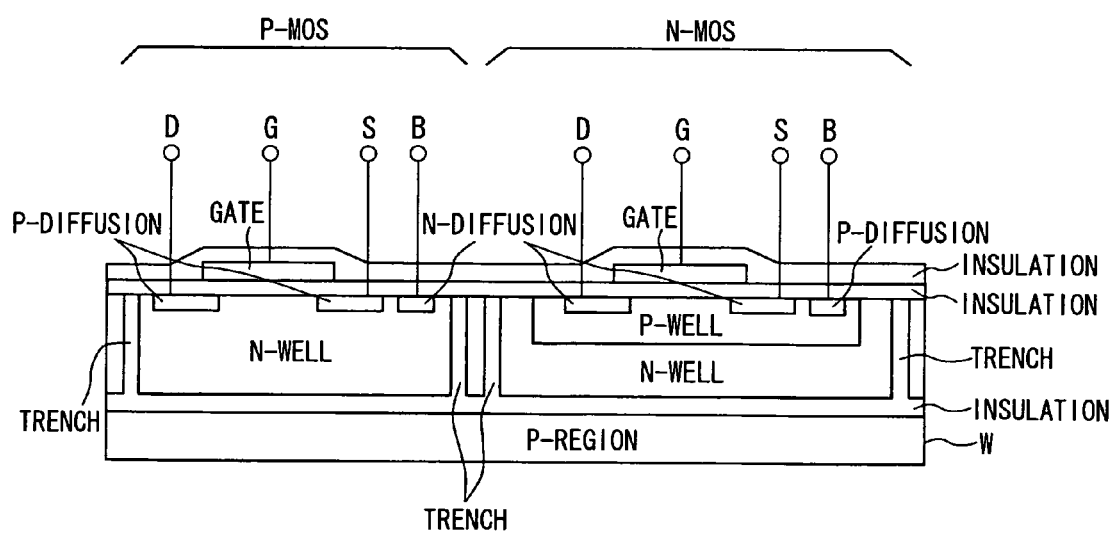

Referring to FIG. 25B, further, when the semiconductor substrate W is based on the SOI (silicon on insulator) structure, the element may be isolated by a trench structure surrounding the P-well that surrounds the layer of the N-MOS transistor by utilizing a silicon oxide ($SiO_2$) of SOI structure. In this case, too, the P-MOS transistor has an N-well surrounding the layer that is forming the P-MOS transistor. When the semiconductor substrate W is of the P-type, therefore, the back gate of the N-MOS transistor can be electrically isolated from the semiconductor substrate W without employing the element-isolation configuration based on the trench structure.

As described above, in the A/D converter circuit 520 of the embodiment, the first ring delay line 21 uses the input voltage Vin as the operation voltage while the ring delay line 61 uses, as the operation voltage, an inverted analog voltage signal equivalent to the one obtained by inverting the input voltage Vin in the increasing/decreasing direction with nearly the central voltage in the range where the input voltage Vin varies as a reference. Therefore, a subtracted result obtained by subtracting the second digital data −Y2 related to the number of times of circulation of the pulse signal circulating in the ring delay line 61 from the first digital data Y1 related to the number of times of circulation of the pulse circulating in the first ring delay line 21, is output as the binary third digital data Y3 to the output line 520b, to thereby cancel the non-linearity of the first ring delay line 21 by the non-linearity of the ring delay line 61.

The second ring delay line 25 in the second converter unit 540 is formed by the NAND circuit 25a and INV circuits 25b, 25c, 25d to 25x that use the predetermined reference voltage Vref1 as a power supply voltage and of which the inverting operation time for outputting the input signal in an inverted manner varies depending upon the power supply voltage, that are connected in the same number and in the same manner as the NAND circuit 21a and INV circuits 21b, 21c, 21d to 21x forming the first ring delay line 21, the NAND circuit 25a which is one of the plurality of inverting circuits starting the operation simultaneously with the start of operation of the start-up inverting circuit in the first ring delay line 21, and the INV circuits 21b, 21c, 21d to 21x and the NAND circuit 21a being so formed as to be thermally coupled to the first ring delay line 21. Therefore, the fourth digital data Yref1 produced by counting the number of circulation of the pulse signal and by subtracting the second data of the last time Yref1l counted and latched one period before the predetermined period from the second present data Yref1p which is the presently counted value, reflects the temperature characteristics of the second ring delay line 25.

Therefore, if the third digital data output maintaining a predetermined value from the digital arithmetic circuit 470 without being affected by a change in the ambient temperature of the first ring delay line 21 in response to a predetermined input voltage Vin (=x 0) is denoted by Y0, the third digital data Y3 output from the digital arithmetic circuit 470 in response to a given input voltage Vin is denoted by Y and a fourth digital data output from the digital arithmetic circuit 243 is denoted by Yref, the DSP 250 obtains a result through the operation expressed as $(Y-Y0)/(Yref-Y0)$ without being affected by the temperature characteristics of the first ring delay line 21 and the ring delay line 61, making it possible to improve the precision inclusive of the linearity of the A/D-converted output. Therefore, the operated result is output as a binary digital data DT to the TAD output line 250a to thereby obtain an A/D-converted value further suppressing variation in the digital data caused by a change in the ambient temperature without requiring any complex operation. Moreover, since no inverting amplifier 460 (fifth embodiment, FIG. 19) is required, the scale of circuit need not be increased.

What is claimed is:

1. An A/D converter circuit for converting an analog voltage signal input to an input signal line into a binary digital data and outputting the same to an output data line, the A/D converter circuit comprising:

a first pulse circulating circuit in which a plurality of inverting circuits are coupled together in a ring form, the plurality of inverting circuits using the analog voltage signal input from the input signal line as a power supply voltage, and of which an inverting operation time for inverting and outputting an input signal varying depending upon the power supply voltage, one of the plurality of inverting circuits being formed as a start-up inverting circuit of which the inverting operation is controlled from an outer side, and a pulse signal circulating accompanying the start of operation of the start-up inverting circuit;

a first counter for counting the number of times of circulation of the pulse signal circulating in the first pulse circulating circuit, and for outputting a counted value;

converted data output control means for outputting the counted value output from the first counter as the binary digital data onto the output data line at a predetermined time point;

a second pulse circulating circuit in which inverting circuits that use a predetermined reference voltage as a power supply voltage and of which an inverting operation time for outputting an input signal in an inverted manner varies depending upon the power supply voltage, are connected in the same number and in the same manner as the inverting circuits that form the first pulse circulating circuit, a start-up inverting circuit which is one of the plurality of inverting circuits starting the operation simultaneously with a start of operation of the start-up inverting circuit in the first pulse circulating circuit, and the inverting circuits and the start-up inverting circuit of the second pulse circulating circuit being formed to be thermally coupled to the first pulse circulating circuit;

a second counter for counting the number of times of circulation of the pulse signal circulating in the second pulse circulating circuit, and for outputting a counted value;

time point notifying means which, when the counted value output from the second counter reaches a predetermined value, notifies a predetermined time point to the converted data output control means; and reference data output means for outputting the predetermined value as a digital data of the predetermined reference voltage.

2. The A/D converter circuit according to claim 1, wherein the reference data output means outputs the counted value of the second counter at the predetermined time point a digital data of the predetermined reference voltage instead of outputting the predetermined value.

3. The A/D converter circuit according to claim 1, wherein the predetermined reference voltage is set to be nearly at a central voltage in a range of the power supply voltage in which a value of the digital data output to the output data line varies nearly constantly relative to a change in temperature.

4. The A/D converter circuit according to claim 1, wherein the time point notifying means notifies the predetermined time point to the converted data output control means even after the counted value has exceeded the predetermined value.

5. The A/D converter circuit according to claim 4, wherein assuming that the predetermined value and the counter value are expressed by binary notation of n bits (n is an integer of 1 or more), an n-th bit of the predetermined value is An and the n-th bit of the counted value is Bn, the time point notifying means is formed by a logic circuit expressed by the following logical formula, $$Zn = \overline{An \cdot Bn + \overline{(An \oplus Bn)} \cdot Z(n-1)}$$

where the least significant first bit is $Z1 = A1 \cdot B1$, to output a time point at which the most significant bit of Zn changes from 0 to 1 as the predetermined time point.

6. The A/D converter circuit according to claim 5, further comprising:

a filter circuit provided between the time point notifying means and the converted data output control means to remove glitch noise that is generated by a small deviation in the time point for shifting a H level to a L level or in the time point for shifting the L level to the H level between logic gates forming the logic circuit.

7. The A/D converter circuit according to claim 5, wherein the time point notifying means includes:

a delay circuit which sets, as a delay time, a time longer than a maximum delay time required for the most significant bit to change from 0 to 1 after the counted value reaching the predetermined value is input to the logic circuit at the counter value output from the second counter, and receives the data related to the least significant bit of the counter value output from the second counter;

a determination circuit for determining whether a past data of the least significant bit input to the delay circuit before the delay time and output from the delay circuit after the passage of the delay time, is in agreement with the present data of the least significant bit of the present counter value output from the second counter; and a notifying circuit for outputting the determined time point as the predetermined time point when the determination circuit has determined that the past data is in agreement with the present data after the most significant bit of Zn has changed from 0 to 1.

8. The A/D converter circuit according to claim 1, wherein when the second counter outputs the counted value as a binary digital data, the time point notifying means detects a logic value of a bit line that varies before or after the counted value reaches the predetermined value, and decides if the counted value has reached the predetermined value.

9. The A/D converter circuit according to claim 1, further comprising:

a filter circuit interposed between a reference-voltage source for generating the predetermined reference voltage and a DC voltage source for feeding a DC voltage to the reference voltage source, the filter circuit suppressing variation in the DC voltage.

10. The A/D converter circuit according to claim 1, wherein the first pulse circulating circuit and the second pulse circulating circuit are arranged on a same semiconductor substrate adjacent and in parallel with each other.

11. The A/D converter circuit according to claim 1, further comprising:

calculation means for calculating a differential data between the binary digital data output from the output line and the digital data of the predetermined reference voltage as a differential voltage data of the analog voltage signal relative to the predetermined reference voltage, and outputting the same.

12. An A/D converter circuit for converting an analog voltage signal input to an input signal line into a binary digital data and outputting the same to an output data line, the A/D converter circuit comprising:

a first pulse circulating circuit in which a plurality of inverting circuits are coupled together in a ring form, the plurality of inverting circuits using the analog voltage signal input from the input signal line as a power supply voltage, and of which an inverting operation time for inverting and outputting the input signal varying depending upon the power supply voltage, one of the plurality of inverting circuits being formed as a start-up inverting circuit of which the inverting operation is controlled from an outer side, and the pulse signal circulating accompanying the start of operation of the start-up inverting circuit;

a first counter for counting the number of times of circulation of the pulse signal circulating in the first pulse circulating circuit, and for outputting a counted value;

a first latch for holding the counted value output from the first counter as a first data of a last time for a predetermined period, and for outputting the same;

first calculation means which regards the counted value output from the first counter as the first present data, subtracts from the first present data the first data of the last time output from the first latch that stores the data at a time point one period before the time point at which the present first data was output, and outputs a subtracted result as a first digital data;

a second pulse circulating circuit in which inverting circuits that use a predetermined reference voltage as a power supply voltage and of which an inverting operation time for outputting an input signal in an inverted manner varies depending upon the power supply voltage, are connected in the same number and in the same manner as the inverting circuits that form the first pulse circulating circuit, a start-up inverting circuit which is one of the plurality of inverting circuits starting an operation simultaneously with the start of operation of the start-up inverting circuit in the first pulse circulating circuit, and the inverting circuits and the start-up inverting circuit being formed to be thermally coupled to the first pulse circulating circuit;

a second counter for counting the number of times of circulation of the pulse signal circulating in the second pulse circulating circuit, and for outputting a counted value;

a second latch for holding the counted value output from the second counter as a second data of the last time for a predetermined period, and for outputting the same;

second calculation means which regards the counted value output from the second counter as the second present data, subtracts from the second present data, the second data of the last time output from the second latch that stores the data at a time point one period before the time point at which the present second data was output, and outputs the subtracted result as a second digital data; and third calculation means which executes a calculation operation expressed as $(Y-Y0)/(Yref-Y0)$, wherein $Y0$ is the first digital data output maintaining a constant value from the first calculation means responsive to the predetermined analog voltage signal without being affected by ambient temperature of the first pulse circulating circuit, $Y$ is the first digital data output from the first calculation means responsive to any analog voltage signal, and $Yref$ is the second digital data output from the second calculation means, and outputs a calculated result as the binary digital data to the output data line.

13. An A/D converter circuit for converting an analog voltage signal input to an input signal line into a binary digital data and outputting the same to an output data line, the A/D converter circuit comprising:

signal selection means for selecting either an analog voltage signal input from the input signal line or a predetermined reference voltage depending upon an input of a selection control signal and outputting a selected analog voltage signal;

a pulse circulating circuit in which a plurality of inverting circuits is coupled together in a ring form, the plurality of inverting circuits using the selected analog voltage signal output from the signal selection means or the predetermined reference voltage as a power supply voltage, and of which an inverting operation time for inverting and outputting the input signal varying depending upon the power supply voltage, one of the plurality of inverting circuits being formed as a start-up inverting circuit of which the inverting operation can be controlled from an outer side, and the pulse signal circulating accompanying the start of operation of the start-up inverting circuit;

a counter for counting the number of times of circulation of the pulse signal circulating in the pulse circulating circuit, and for outputting a counted value;

control means for outputting an analog input selection signal which is for selecting and outputting the analog voltage signal input from the input signal line and a reference voltage input selection signal which is for selecting and outputting the predetermined reference voltage to the signal selection means as the selection control signal;

a first latch which, when the analog input selection signal is input to the signal selection means from the control means, holds the counted value output from the counter as the first data of the last time for a predetermined period, and outputs the same;

first calculation means which regards the counted value output from the counter as a first present data, and subtracts from the first present data the first data of the last time output from the first latch that stores the data at a time point one period before the time point at which the present first data was output, and outputs a subtracted result as a first digital data;

a second latch which, when the reference voltage input selection signal is input to the signal selection means from the control means, holds the counted value output from the counter as the second data of the last time for a predetermined period, and outputs the same;

second calculation means which regards the counted value output from the counter as a second present data, and subtracts from the second present data the second data of the last time output from the second latch that has stored the data at a time point one period before the time point at which the present second data was output, and outputs the subtracted result as a second digital data; and third calculation means which executes a calculation expressed as $(Y-Y0)/(Yref-Y0)$, wherein $Y0$ is the first digital data output maintaining a constant value from the first calculation means responsive to the predetermined analog voltage signal without being affected by ambient temperature of the first pulse circulating circuit, $Y$ is the first digital data output from the first calculation means responsive to any analog voltage signal, and $Yref$ is the second digital data output from the second calculation means, and outputs a calculated result as the binary digital data to the output data line.

14. An A/D converter circuit for converting an analog voltage signal input to an input signal line into a binary digital data and outputting the same to an output data line, the A/D converter circuit comprising:

a first pulse circulating circuit in which a plurality of inverting circuits are coupled together in a ring form, the plurality of inverting circuits using the analog voltage signal input from the input signal line as a power supply voltage, and of which the inverting operation time for inverting and outputting the input signal varying depending upon the power supply voltage, one of the plurality of inverting circuits being formed as a start-up inverting circuit of which an inverting operation is controlled from an outer side, and the pulse signal circulating accompanying the start of operation of the start-up inverting circuit;

a first counter for counting the number of times of circulation of the pulse signal circulating in the first pulse circulating circuit, and for outputting a counted value;

a first latch for holding the counted value output from the first counter as data of the last time for a predetermined period, and for outputting the same;

first calculation means which regards the counted value output from the first counter as the present data, subtracts from the present data the data of the last time output from the first latch that stores the data at a time point one period before the time point at which the present data was output, and outputs a subtracted result as a first digital data;

inverting means that inverts the analog voltage signal in the increasing/decreasing direction based on nearly a central voltage in a range of the power supply voltage in which the first digital data output from the first calculation means varies nearly constantly relative to a change in the power supply voltage, and outputs the inverted analog voltage signal;

a second pulse circulating circuit in which inverting circuits that use the inverted analog voltage signal as a power supply voltage and of which an inverting operation time for outputting the input signal in an inverted manner varies depending upon the power supply voltage, are connected in the same number and in the same manner as the inverting circuits that form the first pulse circulating circuit, one of the plurality of inverting circuits being formed as a start-up inverting circuit of which the inverting operation is controlled from the outer side, and the pulse signal circulating accompanying a start of operation of the start-up inverting circuit;

a second counter for counting the number of times of circulation of the pulse signal circulating in the second pulse circulating circuit, and for outputting a counted value;

a second latch for holding the counted value output from the second counter as an inverted data of the last time for a predetermined period, and for outputting the same;

second calculation means which regards the counted value output from the second counter as the present inverted data, subtracts from the present inverted data the inverted data of the last time output from the second latch that stores the data at a time point one period before the time point at which the present inverted data was output, and outputs a subtracted result as a second digital data;

third calculation means which subtracts the second digital data from the first digital data, and outputs a subtracted result as a third digital data;

a third pulse circulating circuit in which inverting circuits that use a predetermined reference voltage as a power supply voltage and of which an inverting operation time for outputting the input signal in an inverted manner varies depending upon the power supply voltage, are connected in the same number and in the same manner as the inverting circuits that form the first pulse circulating circuit, a start-up inverting circuit which is one of the plurality of inverting circuits starting an operation simultaneously with a start of operation of the start-up inverting circuit in the first pulse circulating circuit, and the inverting circuits and the start-up inverting circuit being formed to be thermally coupled to the first pulse circulating circuit;

a third counter for counting the number of times of circulation of the pulse signal circulating in the third pulse circulating circuit, and for outputting a counted value;

a third latch for holding the counted value output from the third counter as the second data of the last time for a predetermined period, and for outputting the same;

fourth operation means which regards the counted value output from the third counter as the present second data, subtracts from the present second data the second data of the last time output from the third latch that stores the data at a time point one period before the time point at which the present second data was output, and outputs a subtracted result as a fourth digital data; and fifth operation means which executes a calculation expressed as $(Y-Y0)/(Yref-Y0)$, wherein $Y0$ is the third digital data output maintaining a constant value from the third calculation means responsive to the predetermined analog voltage signal without being affected by ambient temperature of the first pulse circulating circuit and of the second pulse circulating circuit, $Y$ is the third digital data output from the third calculation means responsive to any analog voltage signal, and $Yref$ is the fourth digital data output from the fourth operation means, and outputs a calculated result as the binary digital data to the output data line.

15. An A/D converter circuit for converting an analog voltage signal input to an input signal line into a binary digital data and outputting the same to an output data line, the A/D converter circuit comprising:

a first pulse circulating circuit in which a plurality of inverting circuits are coupled together in a ring form, the plurality of inverting circuits using the analog voltage signal input as a reference operation voltage and a voltage twice as great as nearly a central voltage in a range in which the analog voltage signal varies as an operation power supply voltage, and of which an inverting operation time for inverting and outputting the input signal varying depending upon the operation power supply voltage, one of the plurality of inverting circuits being formed as a start-up inverting circuit of which the inverting operation is controlled from an outer side, and the pulse signal circulating accompanying a start of operation of the start-up inverting circuit;

a first counter for counting the number of times of circulation of the pulse signal circulating in the first pulse circulating circuit, and for outputting a counted value;

a first latch for holding the counted value output from the first counter as data of a last time for a predetermined period, and for outputting the same;

first calculation means which regards the counted value output from the first counter as a present data, subtracts from the present data the data of the last time output from the first latch that stores the data at a time point one period before the time point at which the present data was output, and outputs a subtracted result as a first digital data;

a second pulse circulating circuit in which inverting circuits that use a predetermined voltage lower than a minimum voltage of the analog voltage signal as a reference operation voltage and the analog voltage signal as the operation power supply voltage and of which an inverting operation time for inverting and outputting the input signal varies depending upon the operation power supply voltage, are connected in the same number and in the same manner as the inverting circuits that form the first pulse circulating circuit, a start-up inverting circuit which is one of the plurality of inverting circuits starting the operation simultaneously with the start of operation of the start-up inverting circuit in the first pulse circulating circuit to circulate the pulse signal;

a second counter for counting the number of times of circulation of the pulse signal circulating in the second pulse circulating circuit, and for outputting a counted value;

a second latch for holding the counted value output from the second counter as inverted data of the last time for a predetermined period, and for outputting the same;

second calculation means which regards the counted value output from the second counter as a present inverted data, subtracts from the present inverted data an inverted data of the last time output from the second latch that stores the data at a time point one period before the time point at which the present inverted data was output, and outputs a subtracted result as a second digital data;

third calculation means for subtracting the second digital data from the first digital data and for outputting a subtracted result as a third digital data;

a third pulse circulating circuit in which inverting circuits that use a predetermined reference voltage as a power supply voltage and of which an inverting operation time for outputting the input signal in an inverted manner varies depending upon the power supply voltage, are connected in the same number and in the same manner as the inverting circuits that form the first pulse circulating circuit, one of the plurality of inverting circuits starting an operation simultaneously with a start of operation of the start-up inverting circuit in the first pulse circulating circuit, and the inverting circuits and the start-up inverting circuit being formed to be thermally coupled to the first pulse circulating circuit;

a third counter for counting the number of times of circulation of the pulse signal circulating in the third pulse circulating circuit, and for outputting a counted value;

a third latch for holding the counted value output from the third counter as the second data of the last time for a predetermined period, and for outputting the same;

fourth operation means which regards the counted value output from the third counter as the present second data, subtracts from the present second data the second data of the last time output from the third latch that stores the data at a time point one period before the time point at which the present second data was output, and outputs the subtracted result as a fourth digital data; and fifth operation means which executes an operation expressed as $(Y-Y0)/(Yref1-Y0)$, wherein $Y0$ is the third digital data output maintaining a constant value from the third calculation means responsive to the predetermined analog voltage signal without being affected by the ambient temperature of the first pulse circulating circuit and of the second pulse circulating circuit, $Y$ is the third digital data output from the third calculation means responsive to any analog voltage signal, and $Yref1$ is the fourth digital data output from the fourth operation means, and outputs a calculated result as the binary digital data to the output data line.

16. An A/D conversion method for converting an analog voltage signal input to an input signal line into a binary digital data and outputting the same to an output data line, the A/D conversion method comprising:

supplying the analog voltage signal to a first pulse circulating circuit in which a plurality of inverting circuits is coupled in a ring form, so that the plurality of inverting circuits operates with the analog voltage signal and circulates a pulse signal therein;

counting the number of times of circulation of the pulse signal in the first pulse circulating circuit and for outputting a first counted value;

supplying an analog reference voltage signal to a second pulse circulating circuit in which a plurality of inverting circuits is coupled in a ring form in the same configuration as in the first pulse circulating circuit, so that the plurality of inverting circuits operates with the analog reference voltage signal and circulates the pulse signal therein in the same manner as in the first pulse circulating circuit, the second pulse circulating circuit being thermally coupled to the first pulse circulating circuit;

counting the number of times of circulation of the pulse signal in the second pulse circulating circuit and for outputting a second counted value;

determining a predetermined time point when the second counted value reaches a predetermined value; and subtracting the second counted value, which is output at the predetermined time point, from the first counted value, which is output at the predetermined time point, thereby producing a digital output data.

17. An A/D conversion method for converting an analog voltage signal input to an input signal line into a binary digital data and outputting the same to an output data line, the A/D conversion method comprising:

supplying the analog voltage signal to a first pulse circulating circuit in which a plurality of inverting circuits is coupled in a ring form, so that the plurality of inverting circuits operates with the analog voltage signal and circulates a pulse signal therein;

counting the number of times of circulation of the pulse signal in the first pulse circulating circuit for a predetermined period and for outputting a first counted value;

supplying an analog reference voltage signal to a second pulse circulating circuit in which a plurality of inverting circuits is coupled in a ring form in the same configuration as in the first pulse circulating circuit, so that the plurality of inverting circuits operates with the analog reference voltage signal and circulates the pulse signal therein in the same manner as in the first pulse circulating circuit, the second pulse circulating circuit being thermally coupled to the first pulse circulating circuit;

counting the number of times of circulation of the pulse signal in the second pulse circulating circuit for the predetermined period and for outputting a second counted value;

calculating a first difference between two of the first counted values, which are counted and output in a present period and in a last period;

calculating a second difference between two of the second counted values, which are counted and output in the present period and in the last period; and calculating a ratio defined as $(Y-Y0)/(Yref-Y0)$, by using the first difference $Y$, the second difference $Yref$ and a predetermined value $Y0$, which is a fixed value corresponding to a first difference calculated in each period and unchanged irrespective of a surrounding temperature of the first pulse circulating circuit.

* * * * *